(12) United States Patent
Xiao et al.

(10) Patent No.: US 12,210,255 B2
(45) Date of Patent: Jan. 28, 2025

(54) ARRAY SUBSTRATE AND METHOD FOR MANUFACTURING SAME, AND DISPLAY DEVICE

(71) Applicants: Chengdu BOE Display Sci-tech Co., Ltd., Sichuan (CN); BOE Technology Group Co., Ltd., Beijing (CN)

(72) Inventors: Feng Xiao, Beijing (CN); Toshifumi Yagi, Beijing (CN); Yanmei Luo, Beijing (CN); Guidong Yang, Beijing (CN)

(73) Assignees: CHENGDU BOE DISPLAY SCI-TECH CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/017,671

(22) PCT Filed: Apr. 28, 2022

(86) PCT No.: PCT/CN2022/090087
§ 371 (c)(1),
(2) Date: Jan. 24, 2023

(87) PCT Pub. No.: WO2023/206295
PCT Pub. Date: Nov. 2, 2023

(65) Prior Publication Data
US 2024/0255817 A1    Aug. 1, 2024

(51) Int. Cl.
*G02F 1/1362* (2006.01)
*G02F 1/1337* (2006.01)
(Continued)

(52) U.S. Cl.
CPC .. *G02F 1/136227* (2013.01); *G02F 1/136286* (2013.01); *G02F 1/1368* (2013.01);
(Continued)

(58) Field of Classification Search
CPC ............. G02F 1/1333; G02F 1/133345; G02F 1/1337; G02F 1/133757; G02F 1/133773;
(Continued)

(56) References Cited

U.S. PATENT DOCUMENTS

2012/0268453 A1* 10/2012 Hwang .................. G09G 3/003
                                                        345/419
2012/0274885 A1* 11/2012 Shin .................. G02F 1/133707
                                                        349/110
(Continued)

FOREIGN PATENT DOCUMENTS

CN      102402087 A      4/2012
CN      105137676 A      12/2015
(Continued)

*Primary Examiner* — Thoi V Duong
(74) *Attorney, Agent, or Firm* — XSENSUS LLP

(57) ABSTRACT

Provided is an array substrate. The array substrate includes a base substrate, a gate line, a data line, a discharge line, a first pixel electrode, a first thin film transistor, a second thin film transistor and a first connection line. A control electrode of the first thin film transistor and a control electrode of the second thin film transistor are both connected to the gate line. The first electrode of the first thin film transistor is connected to the data line. Both the second electrode of the first thin film transistor and the first electrode of the second thin film transistor are connected to the first pixel electrode by the first connection line. The second electrode of the second thin film transistor is connected to the discharge line.

19 Claims, 12 Drawing Sheets

(51) Int. Cl.
  *G02F 1/1343* (2006.01)
  *G02F 1/1368* (2006.01)
  *H01L 27/12* (2006.01)

(52) U.S. Cl.
  CPC ........ *H01L 27/1222* (2013.01); *H01L 27/124* (2013.01); *H01L 27/1259* (2013.01); *G02F 1/133757* (2021.01); *G02F 1/136213* (2013.01)

(58) Field of Classification Search
  CPC ............. G02F 1/1343; G02F 1/134309; G02F 1/1362; G02F 1/136213; G02F 1/136227; G02F 1/13624; G02F 1/136286; G02F 1/1368; H01L 27/1222; H01L 27/124; H01L 27/1259
  See application file for complete search history.

(56) References Cited

U.S. PATENT DOCUMENTS

| | | |
|---|---|---|
| 2013/0010247 A1 | 1/2013 | Wei et al. |
| 2016/0291383 A1 | 10/2016 | Han et al. |
| 2018/0217463 A1 | 8/2018 | Guo |
| 2020/0004069 A1 | 1/2020 | Kim et al. |
| 2021/0278734 A1 | 9/2021 | Park |
| 2022/0102389 A1 | 3/2022 | Wang et al. |
| 2022/0308407 A1 | 9/2022 | Um et al. |
| 2023/0137930 A1 | 5/2023 | Tian et al. |

FOREIGN PATENT DOCUMENTS

| | | |
|---|---|---|
| CN | 106647078 A | 5/2017 |
| CN | 109634015 A | 4/2019 |
| CN | 110646994 A | 1/2020 |
| CN | 111725245 A | 9/2020 |
| CN | 112068371 A | 12/2020 |
| CN | 112799255 A | 5/2021 |
| CN | 113311624 A | 8/2021 |
| CN | 113341621 A | 9/2021 |
| CN | 113534561 A | 10/2021 |
| CN | 114280861 A | 4/2022 |
| KR | 2011-0006595 A | 1/2011 |

\* cited by examiner

006
ARRAY SUBSTRATE AND METHOD FOR MANUFACTURING SAME, AND DISPLAY DEVICE

CROSS-REFERENCE TO RELATED APPLICATION

This application is a U.S. national stage of international application No. PCT/CN2022/090087, filed on Apr. 28, 2022, the disclosure of which is incorporated herein by reference in its entirety.

TECHNICAL FIELD

The present disclosure relates to the field of display devices, and in particular, relates to an array substrate and a method for manufacturing the same, a liquid crystal display panel, and a display device.

BACKGROUND

Liquid crystal display panels (LCDs) are widely used in large-sized display devices due to low power consumption.

SUMMARY

Embodiments of the present disclosure provide an array substrate and a method for manufacturing the same, a liquid crystal display panel, and a display device. In this way, a parasitic capacitance is reduced, thereby improving display effect. The technical solutions are as follows:

In a first aspect, the embodiments of the present disclosure provide an array substrate. The array substrate includes a base substrate, a signal line, and a plurality of first pixel units; wherein the signal line is disposed on a bearing surface of the base substrate, and includes a gate line, a data line and a discharge line that are insulated from each other, wherein the gate line extends along a first direction, the data line extends along a second direction, the discharge line extends along a third direction, both the second direction and the third direction being intersected with the first direction, and the gate line and the data line are intersected with each other to define a plurality of sub-pixel regions; and the first pixel unit includes a first pixel electrode, a first thin film transistor, a second thin film transistor, and a first connection line; wherein a plurality of the first pixel electrodes are respectively disposed in the plurality of sub-pixel regions, and orthographic projections of the first thin film transistor and the second thin film transistor on the bearing surface are both at least partially overlapped with an orthographic projection of the gate line on the bearing surface; and a control electrode of the first thin film transistor and a control electrode of the second thin film transistor are both electrically connected to the gate line, a first electrode of the first thin film transistor is electrically connected to the data line, a second electrode of the first thin film transistor and a first electrode of the second thin film transistor are both electrically connected to the first pixel electrode by the first connection line, and a second electrode of the second thin film transistor is electrically connected to the discharge line.

Optionally, an orthographic projection of the first connection line on the bearing surface is outside an orthographic projection of the gate line on the bearing surface; or the first connection line includes an overlap segment and a connection segment that are connected to each other; wherein an orthographic projection of the overlap segment on the bearing surface is within the orthographic projection of the gate line on the bearing surface, the overlap segment is perpendicular to the first direction, and the overlap segment is perpendicular to the first direction, and the overlap segment is electrically connected to the second electrode of the first thin film transistor and the first electrode of the second thin film transistor; and an orthographic projection of the connection segment on the bearing surface is outside the orthographic projection of the gate line on the bearing surface, and the connection segment is electrically connected to the first pixel electrode.

Optionally, the first connection line is in a same layer as at least one of the second electrode of the first thin film transistor, the first electrode of the second thin film transistor, the data line, and the discharge line.

Optionally, an active layer of the first thin film transistor is connected to an active layer of the second thin film transistor, and the second electrode of the first thin film transistor is multiplexed into the first electrode of the second thin film transistor.

Optionally, arrangement directions of the first electrode and the second electrode of the first thin film transistor are consistent with arrangement directions of the first electrode and the second electrode of the second thin film transistor.

Optionally, the first electrode and the second electrode of the first thin film transistor are arranged along the first direction; and the first pixel unit further includes a second connection line, wherein the first electrode of the first thin film transistor is electrically connected to the data line by the second connection line, and an orthographic projection of the second connection line on the bearing surface is at least partially outside the orthographic projection of the gate line on the bearing surface.

Optionally, the first electrode and the second electrode of the first thin film transistor are arranged along the second direction; and the first pixel unit further includes a third connection line, wherein the second electrode of the second thin film transistor is electrically connected to the discharge line by the third connection line, and an orthographic projection of the third connection line is on the bearing surface is within the orthographic projection of the gate line on the bearing surface, or at least partially outside the orthographic projection of the gate line on the bearing surface.

Optionally, the first electrode and the second electrode of the first thin film transistor are arranged along the second direction, and the first electrode and the second electrode of the second thin film transistor are arranged along the first direction.

Optionally, the gate line includes a body portion and a branch portion that are connected each other; wherein the orthographic projection of the first thin film transistor on the bearing surface is at least partially overlapped with an orthographic projection of the body portion on the bearing surface, and the control electrode of the first thin film transistor is electrically connected to the body portion; and the orthographic projection of the second thin film transistor on the bearing surface is at least partially overlapped with an orthographic projection of the branch portion on the bearing surface, and the control electrode of the second thin film transistor is electrically connected to the branch portion.

Optionally, the gate line includes a main gate line and an auxiliary gate line; wherein
- a gap is present between the main gate line and the auxiliary gate line, the orthographic projection of the first thin film transistor on the bearing surface is at least partially overlapped with an orthographic projection of the main gate line on the bearing surface, and the control electrode of the first thin film transistor is electrically connected to the main gate line; and
- the orthographic projection of the second thin film transistor on the bearing surface is at least partially overlapped with an orthographic projection of the auxiliary gate line on the bearing surface, and the control electrode of the second thin film transistor is electrically connected to the auxiliary gate line.

Optionally, the first pixel electrode includes a first part and a second part that are connected to each other, wherein the first part and the second part are arranged along the second direction, in the first direction, and the first part and the second part are misaligned with each other in the first direction.

Optionally, the array substrate further includes a plurality of second pixel units; wherein
- the second pixel unit includes a second pixel electrode and a third thin film transistor, wherein a plurality of the second pixel electrodes are respectively disposed in the plurality of sub-pixel regions, and the second pixel electrodes and the first pixel electrodes are alternately distributed in the second direction; and
- a first electrode of the third thin film transistor is electrically connected to the data line, a second electrode of the third thin film transistor is electrically connected to the second pixel electrode, and a control electrode of the third thin film transistor is electrically connected to the gate line.

Optionally, a length of a channel region of the first thin film transistor ranges from 4 μm to 5 μm, and a width of the channel region of the first thin film transistor ranges from 5 μm to 15 μm;
- a length of a channel region of the second thin film transistor ranges from 8 μm to 14 μm, and a width of the channel region of the second thin film transistor ranges from 3 μm to 4 μm; and
- a length and a width of a channel region of the third thin film transistor are respectively equal to the length and the width of the channel region of the first thin film transistor.

In a second aspect, the embodiments of the present disclosure further provide a method for manufacturing an array substrate. The method includes:
providing a base substrate;
forming a gate line on a bearing surface of the base substrate, wherein the gate line extends along a first direction;
forming a first thin film transistor and a second thin film transistor on the bearing surface of the base substrate, wherein orthographic projections of the first thin film transistor and the second thin film transistor on the bearing surface are both at least partially overlapped with an orthographic projection of the gate line on the bearing surface, and a control electrode of the first thin film transistor and a control electrode of the second thin film transistor are both electrically connected to the gate line;

forming a data line, a discharge line, and a first connection line are formed on the bearing surface of the base substrate, wherein the data line extends along a second direction, the discharge line extends along a third direction, the second direction and the third direction both being intersected with the first direction, and the gate line and the data line are intersected with each other to define a plurality of sub-pixel regions, and the data line is electrically connected to a first electrode of the first thin film transistor, the discharge line is electrically connected to a second electrode of the second thin film transistor, and the first connection line is electrically connected to a second electrode of the first thin film transistor and a first electrode of the second thin film transistor; and forming a plurality of first pixel electrodes on the bearing surface of the base substrate, wherein the plurality of first pixel electrodes are respectively disposed in the plurality of sub-pixel regions, and the first pixel electrode is electrically connected to the first connection line to form a plurality of first pixel units on the bearing surface of the base substrate.

In a third aspect, the embodiments of the present disclosure further provide a liquid crystal display panel. The liquid crystal display panel includes a color filter substrate, a liquid crystal layer, and the array substrate described in the first aspect; wherein the color filter substrate is arranged opposite to the array substrate, and the liquid crystal layer is disposed between the color filter substrate and the array substrate.

In a fourth aspect, the embodiments of the present disclosure further provide a display device. The display device includes a backlight, and the liquid crystal display panel described in the third aspect; wherein the backlight is disposed at a side, distal from the color filter substrate, of the array substrate.

BRIEF DESCRIPTION OF THE DRAWINGS

For clearer descriptions of the technical solutions in the embodiments of the present disclosure, accompanying drawings required for describing the embodiments are briefly introduced hereafter. Obviously, the accompanying drawings in the following description show merely some embodiments of the present disclosure, and a person of ordinary skill in the art may further derive other drawings from these accompanying drawings without creative efforts.

DETAILED DESCRIPTION

For clearer descriptions of the purposes, technical solutions, and advantages of the present disclosure, some embodiments of the present disclosure are described in detail hereinafter with reference to the accompanying drawings.

Unless otherwise defined, technical or scientific terms used herein shall have ordinary meaning as understood by a person with ordinary skills in the art to which the present this disclosure belongs. The terms "first," "second," "third," and the like used in the description and claims do not indicate any order, quantity, or importance, but are merely used to distinguish different components. Likewise, the terms "one," "a/an," and the like do not indicate a quantitative limitation, but rather indicate the presence of at least one. The terms "include," "comprise" and the like are referred to that the elements or items listed before "include" or "comprise" cover the elements or items listed after "include" or "comprise" and their equivalents, and do not exclude other components or objects. The terms "coupled," "connected" and the like are not limited to physical or mechanical connections, but may include electrical connections, whether direct or indirect. The terms "up," "down," "left," "right," and the like are only used to indicate a relative positional relationship, and when an absolute position of the described object changes, the relative positional relationship may change accordingly.

The liquid crystal display panel has a specific viewing angle, and a relatively normal picture is observable within a range of viewing angle. However, under different viewing angles, especially at large viewing angles, color distortion is caused. In the related art, to avoid color distortion at a large viewing angle of the liquid crystal display panel, the liquid crystal display panel usually adopts a multi-domain vertical alignment (VA) display mode, and the pixel structure is a multi-domain pixel structure. For example, color distortion is greatly reduced, and the display effect of the liquid crystal display panel is improved by providing an eight-domain pixel structure. Discharge lines are provided in the eight-domain pixel structure. In addition to being connected to the data line by the thin film transistor, some pixel electrodes are further connected to the discharge line by the thin film transistor. That is, these pixel electrodes are at least connected to two thin film transistors, and the two thin film transistors are respectively connected to the pixel electrodes by connection lines, such that a large-size overlap is defined between the connection lines and the gate electrode. As a result, a great parasitic capacitance is generated, and thus improvement of the display effect of the liquid crystal display panel is affected.

Figure 1:
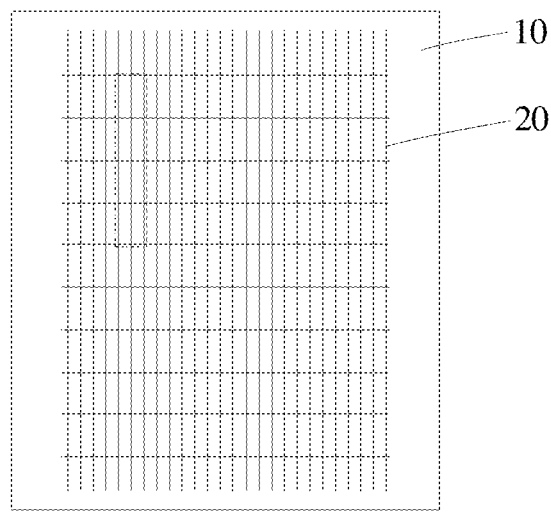
FIG. 1 is a schematic structural diagram of an array substrate according to an embodiment of the present disclosure.
Figure 2:
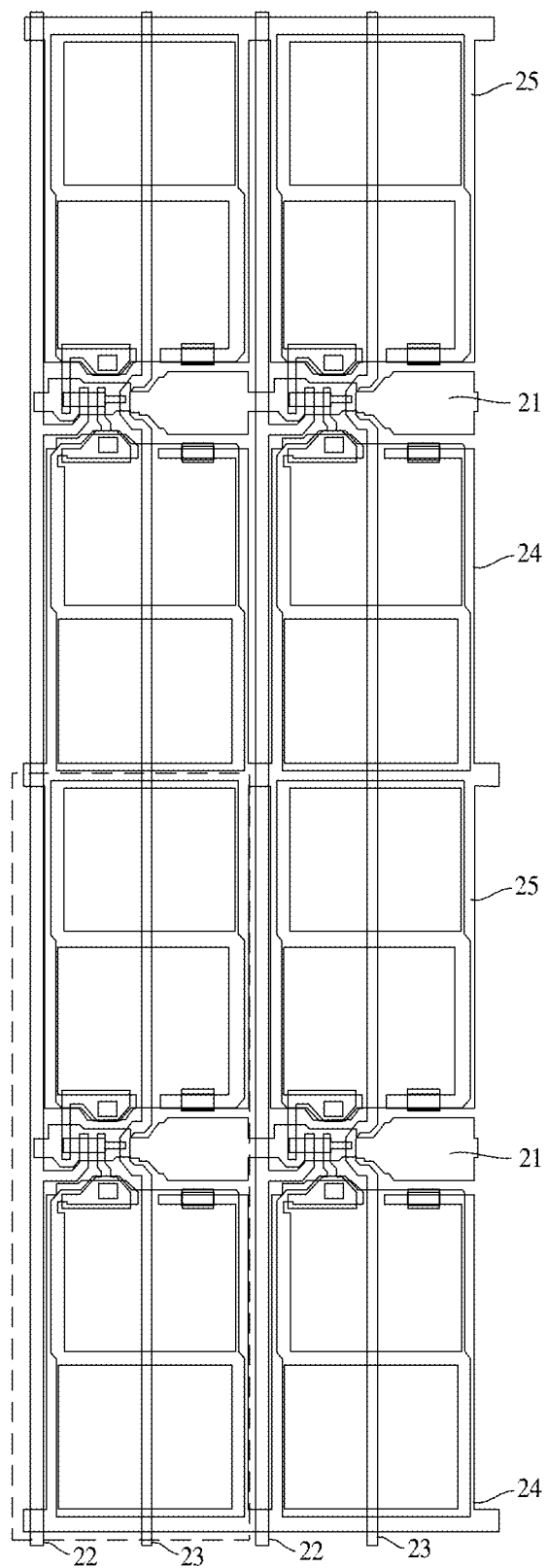
FIG. 2 is an enlarged schematic diagram at a dotted line in FIG. 1.
Figure 3:
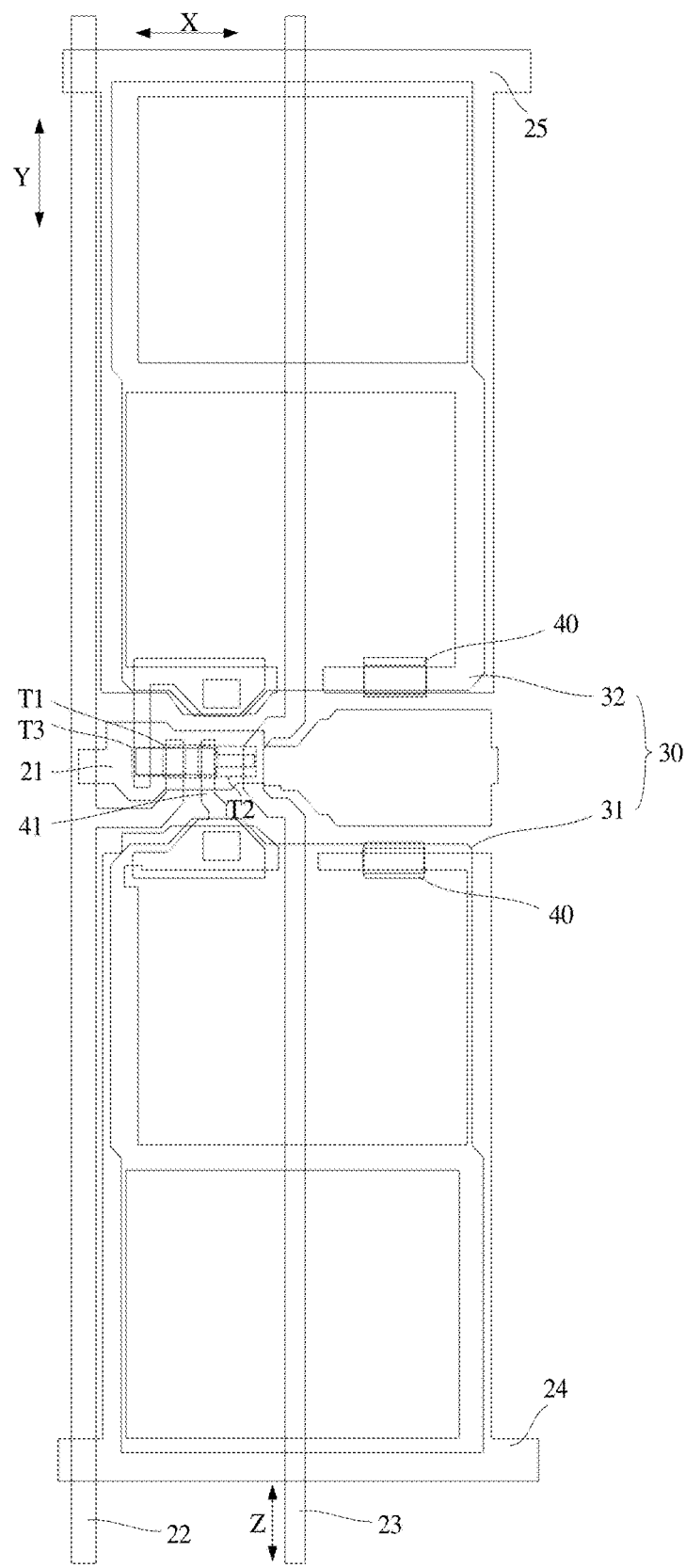
FIG. 3 is an enlarged schematic diagram at a dashed line in FIG. 2.

FIG. 1 is a schematic structural diagram of an array substrate according to an embodiment of the present disclosure. As shown in FIG. 1, the array substrate includes a base substrate 10 and a signal line 20. FIG. 2 is an enlarged schematic view at a dotted line in FIG. 1. FIG. 3 is an enlarged schematic view at a dotted line in FIG. 2. As shown in FIG. 2 and FIG. 3, the array substrate further includes a plurality of pixel units, wherein the pixel unit includes a pixel electrode 30 and a thin film transistor.

The base substrate 10 has two opposite surfaces, one of which is a bearing surface. Each of the signal line 20, the pixel electrode 30, and the thin film transistor is disposed on the bearing surface of the base substrate 10. The expression "disposed on the bearing surface of the base substrate 10" herein includes not only a case of being directly disposed on the bearing surface and in direct contact with the bearing surface, but also a case of being separated by other structures from the bearing surface and without direct contact with the bearing surface.

The signal line 20 is disposed on the bearing surface of the base substrate 10, and includes a gate line 21 and a data line 22 that are insulated from each other. The gate line 21 extends along a first direction X, and the data line 22 extends along a second direction Y. Both the first direction X and the second direction Y are parallel to the bearing surface, and the first direction X is intersected with the second direction Y. For example, the first direction X and the second direction Y are perpendicular to each other, or the first direction X is intersected with the second direction Y and form an acute angle therebetween.

A plurality of gate lines 21, data lines 22, and pixel electrodes 30 may be provided. The plurality of gate lines 21 and data lines 22 define a plurality of sub-pixel regions on the bearing surface, and each of the plurality of sub-pixel regions is provided with two pixel electrodes.

As shown in FIG. 3, the plurality of pixel electrodes 30 include a first pixel electrode 31 and a second pixel electrode 32. FIG. 3 shows the first pixel electrode 31 in one of two adjacent sub-pixel regions in the second direction Y, and the second pixel electrode 32 in the other one of two adjacent sub-pixel regions in the second direction Y. The first pixel electrode 31 is disposed at one side of the gate line 21, and the second pixel electrode 32 is disposed at the other side of the gate line 21.

The signal line 20 further includes a discharge line 23. The discharge line 23 extends along a third direction Z. The third direction Z is parallel to the bearing surface and are intersected with the first direction X. As an example, in the embodiments of the present disclosure, the third direction Z is perpendicular to the first direction X. In other examples, the third direction Z may form an acute angle with the first direction X. A plurality of discharge lines 23 may be provided. The plurality of discharge lines 23 and the plurality of data lines 22 are alternately spaced apart from each other in the first direction X.

Figure 4:
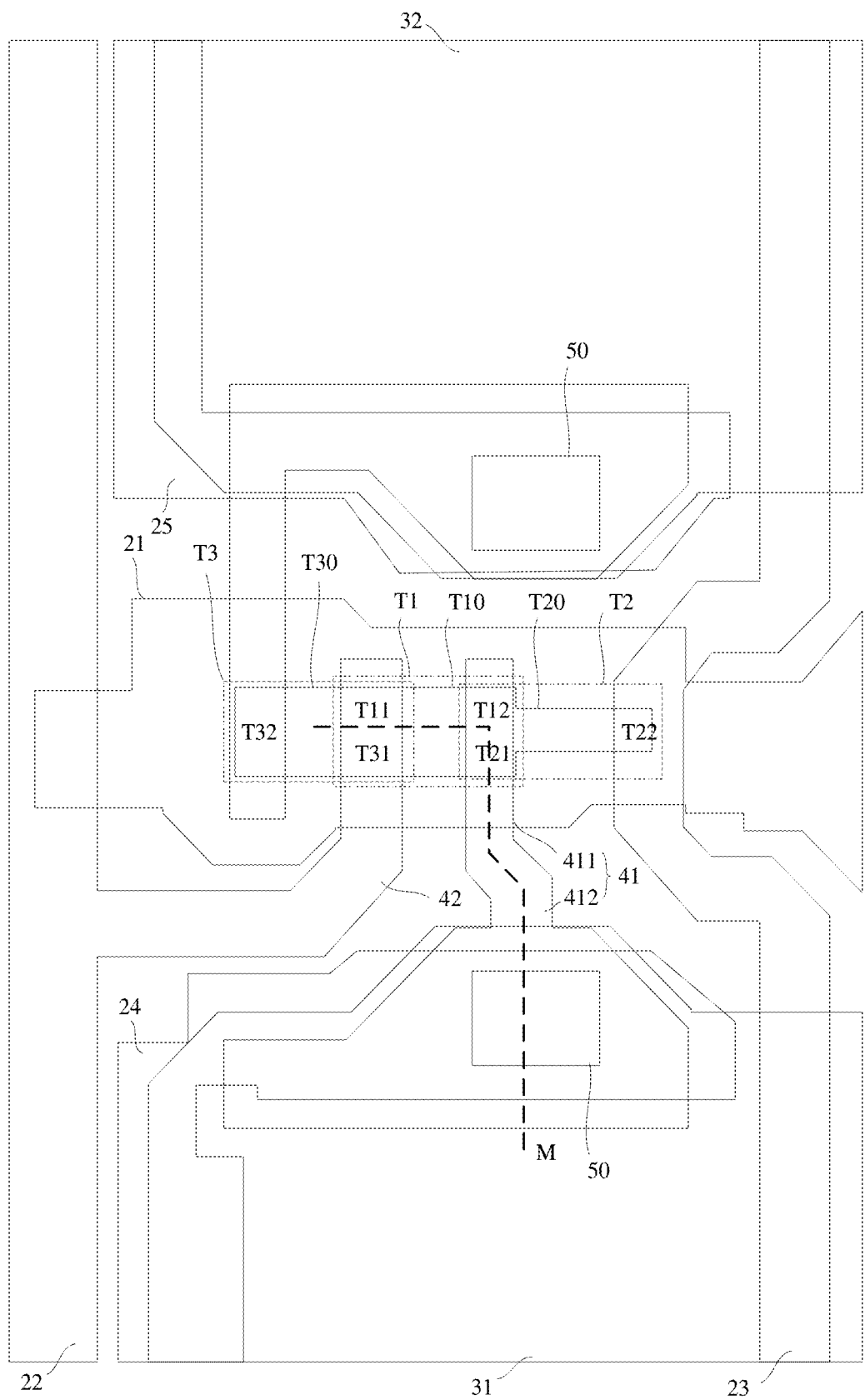
FIG. 4 is a partial enlarged schematic diagram of FIG. 3.

FIG. 4 is a partial enlarged schematic diagram of FIG. 3. As shown in FIG. 4, the thin film transistor includes a first thin film transistor T1 and a second thin film transistor T2. Orthographic projections of the first thin film transistor T1 and the second thin film transistor T2 on the bearing surface are at least partially overlapped with an orthographic projection of the gate line 21 on the bearing surface. Taking the first thin film transistor T1 as an example, the expression that "the orthographic projection of the first thin film transistor T1 on the bearing surface is at least partially overlapped with the orthographic projection of the gate line 21 on the bearing surface" not only indicate a case that the orthographic projection of the first thin film transistor T1 on the bearing surface is entirely within the orthographic projection of the gate line 21 on the bearing surface, but also indicate a case that a part of the orthographic projection of the first thin film transistor T1 on the bearing surface is within the orthographic projection of the gate line 21 on the bearing surface, and the other part is outside the orthographic projection of the gate line 21 on the bearing surface. For example, a part of the orthographic projection, of the second electrode of the first thin film transistor T1, on the bearing surface is outside the orthographic projection of the gate line 21 on the bearing surface; and a part of the orthographic projection, of the first electrode of the second thin film transistor T2, on the bearing surface is outside the orthographic projection of the gate line 21 on the bearing surface.

A control electrode of the first thin film transistor T1 and a control electrode of the second thin film transistor T2 are both electrically connected to the gate line 21. A first electrode A second electrode T12 of the first thin film transistor T1 and a first electrode T21 of the second thin film transistor T2 are both electrically connected to the first pixel electrode 31 by the first connection line 41. A second electrode T22 of the second thin film transistor T2 is electrically connected to the discharge line 23. The first electrode of the thin film transistor is one of the source electrode and the drain electrode of the thin film transistor, and the second electrode of the thin film transistor is the other one of the source electrode and the drain electrode of the thin film transistor. The term "electrically connected" herein refers to a mating relationship for forming an electrical path. For example, the control electrode of the first thin film transistor T1 is electrically connected to the gate line 21, which means that an electrical path is formed between the control electrode of the first thin film transistor T1 and the gate line 21. In this way, the electrical signal loaded by the gate line 21 acts on the control electrode of the first thin film transistor T1.

The plurality of pixel units include a plurality of first pixel units and a plurality of second pixel units. The first pixel unit includes a first pixel electrode 31, a first thin film transistor T1, a second thin film transistor T2, and a first connection line 41. The second pixel unit includes a second pixel electrode 32 and a third thin film transistor T3. The first pixel electrode 31 of the first pixel unit and the second pixel electrode 32 of the second pixel unit are alternately distributed in the second direction Y.

In the array substrate according to the embodiments of the present disclosure, the second electrode T12 of the first thin film transistor T1 and the first electrode T21 of the second thin film transistor T2 are both electrically connected to the first pixel electrode 31 by the first connection line 41. In this way, there is no need to connect the second electrode T12 of the first thin film transistor T1 and the first electrode T21 of the second thin film transistor T2 to the first pixel electrode 31 by different connection lines respectively. Therefore, the number of connection lines that need to be arranged is reduced, a total area of overlap regions between the connection lines and the gate line 21 is reduced, and the parasitic capacitance is reduced, which is conducive to improving the display effect of the liquid crystal display panel.

As shown in FIG. 4, the first connection line 41 is partially overlapped with the gate line 21. That is, the orthographic projection of the first connection line 41 on the bearing surface is within in the orthographic projection of the gate line 21 on the bearing surface.

In the embodiments of the present disclosure, the first connection line 41 includes an overlap segment 411 and a connection segment 412 that are connected to each other. An orthographic projection of the overlap segment 411 on the bearing surface is within the orthographic projection of the gate line 21 on the bearing surface, and the overlap segment 411 is perpendicular to the first direction X. The overlap segment 411 is connected to the second electrode T12 of the first thin film transistor T1, and the first electrode T21 of the second thin film transistor T2. An orthographic projection of the connection segment 412 on the bearing surface is outside the orthographic projection of the gate line 21 on the bearing surface, and the connection segment 412 is connected to the first pixel electrode 31.

The overlap segment 411 is strip-shaped, and the overlap segment 411 is perpendicular to the first direction X. That is, a length or width direction of the overlap segment 411 is perpendicular to the first direction X.

The orthographic projection of the overlap segment 411 on the bearing surface is overlapped with the orthographic projection of the gate line 21 on the bearing surface, such that a parasitic capacitance is generated. The overlap segment 411 is perpendicular to the first direction X, so as to minimize the length of the overlap segment 411. In this way, it is conducive to further reducing the parasitic capacitance, and further improving the display effect of the liquid crystal display panel.

In other examples, the orthographic projection of the first connection line 41 on the bearing surface may be outside the orthographic projection of the gate line 21 on the bearing surface, which is equivalent to the length of the overlap segment 411 being 0. The first connection line 41 is not overlapped with the gate line 21, such that the parasitic capacitance between the first connection line 41 and the gate line 21 is further reduced.

Optionally, the first connection line 41 is in a same layer as at least one of the second electrode T12 of the first thin film transistor T1, the first electrode T21 of the second thin film transistor T2, the data line 22 and the discharge line 23.

The expression "in a same layer" herein includes, but is not limited to, being disposed in a same surface of a same structure, formed in a same process, and formed by a same film layer. For example, the first connection line 41 and the second electrode T12 of the first thin film transistor T1 are disposed in a same layer. This means that the first connection line 41 and the second electrode T12 of the first thin film transistor T1 are formed in a same patterning process.

The number of patterning processes is reduced by arranging different elements in a same layer, which is conducive to reducing a total thickness of the array substrate.

In some examples, at least two of the first connection line 41, the second electrode T12 of the first thin film transistor T1, the first electrode T21 of the second thin film transistor T2, the data line 22, and the discharge line 23 are disposed in a same layer.

In the embodiments of the present disclosure, the first connection line 41, the second electrode T12 of the first thin film transistor T1, the first electrode T21 of the second thin film transistor T2, the data line 22, and the discharge line 23 are disposed in a same layer, and are formed by a same patterning process using a same film layer.

A thin film transistor generally includes an active layer, a control electrode, a source electrode, and a drain electrode. In the embodiments of the present disclosure, as shown in FIG. 4, an active layer T10 of the first thin film transistor T1 and an active layer T20 of the second thin film transistor T2 are connected to each other. The second electrode T12 of the first thin film transistor T1 is multiplexed into the first electrode T21 of the second thin film transistor T2. That is, the active layers of the two thin film transistors are integrally formed, and the second electrode T12 of the first thin film transistor T1 and the first electrode T21 of the second thin film transistor T2 are integrally formed.

The second electrode T12 of the first thin film transistor T1 and the first electrode T21 of the second thin film transistor T2 are integrally formed, such that the parasitic capacitances between both the two electrodes and the gate line 21 are further reduced, thereby further improving the display effect of the liquid crystal display panel.

In the liquid crystal display panel, a region for displaying the pictures is generally a region where the pixel electrode is disposed, and a region where the thin film transistor is disposed is not for displaying. The second electrode T12 of the first thin film transistor T1 is multiplexed into the first electrode T21 of the second thin film transistor T2, such that an area occupied by the third thin film transistor T3 and the first thin film transistor T1 on the base substrate 10 is reduced. In this way, a larger space is reserved for arranging the pixel electrodes, which is conducive to improving the aperture ratio of the pixel. The liquid crystal display panel is usually provided with a spacer. Both the spacer and the thin film transistor are disposed in regions that are outside the regions where the pixel electrodes are disposed, such that the area occupied by the thin film transistors on the base substrate 10 is reduced. In this way, a larger space is reserved for arranging the spacer, which facilitates the arrangement of the spacer.

For example, the first thin film transistor T1 and the second thin film transistor T2 are disposed between the data line 22 and the discharge line 23. The spacer may be disposed at a side, distal from the second thin film transistor T2, of the discharge line 23.

Optionally, as shown in FIG. 3, the array substrate further includes pads 40. The pads 40 are disposed at a side, distal from the thin film transistor, of the discharge line 23, and the pads 40 are distributed at both sides of the gate line 21. The pad 40 have a function of increasing the height of partial regions, such that the region, above the gate line 21, between two pads 40 is recessed, thereby providing a space for arranging pads. Two sides of the spacer are supported and limited by the pad 40, such that the spacer is prevented from deforming towards both sides of the gate line 21.

The pad 40 may have a single-layer structure or a multi-layer structure. In a case that the pad 40 has a multi-layer structure, each layer in the pad 40 may be disposed in a same layer as other structures. For example, a part of the pad 40 may be disposed in a same layer as the active layer. When manufacturing the active layer of each thin film transistor, a part of the pad 40 may be formed, by leaving a part of materials in the region where the pad 40 needs to be formed, in the patterning process. The other part of the pad 40 may be disposed in a same layer as the first electrode and the second electrode of the thin film transistor, the first connection line 41 and the like. When manufacturing the first connection line 41, a part of the pad block 40 may be formed, by leaving a part of materials in the region where the pad 40 needs to be formed, in the patterning process. In this way, a thickness of the region is gradually increased by leaving materials in a same region, such that the pad 40 is formed.

As shown in FIG. 4, arrangement directions of the first electrode T11 and the second electrode T12 of the first thin film transistor T1 are consistent with arrangement directions of the first electrode T2'1 and the second electrode T22 of the second thin film transistor T2 respectively.

Due to the influence of process, different thin film transistors in a same array substrate may have certain differences in characteristic. Especially, thin film transistors with different directions have greater difference. The direction of the thin film transistor is referred to the arrangement directions of the first electrode and the second electrode of the thin film transistor. The thin film transistors with different directions herein are referred to the thin film transistors with different alignment directions of the first electrode and the second electrode.

For example, in the patterning process, when stitching exposure is performed, a certain error in a direction parallel to the bearing surface may be present, and errors in different directions are also difficult to accurately control. During etching, etching speeds in different directions are different, which has an influence on etching amounts in different directions.

In the embodiments of the present disclosure, the arrangement directions of the two electrodes of the first thin film transistor T1 (i.e., the first electrode and the second electrode) are consistent with the arrangement directions of the two electrodes of the second thin film transistor T2, such that the direction of the first thin film transistor T1 is consistent with the direction of the second thin film transistor T2. In this way, it is conducive to reducing the differences between the first thin film transistor T1 and the second thin film transistor T2 in characteristic.

As an example, as shown in FIG. 4, the first electrode T11 and the second electrode T12 of the first thin film transistor T1 are arranged along the first direction X.

That is, the first thin film transistor T1 and the second thin film transistor T2 are both arranged along the first direction X, which is conducive to arranging the second electrode T22 of the second thin film transistor T2. The first thin film transistor T1 and the second thin film transistor T2 are disposed between the data line 22 and the discharge line 23. The second electrode T22 of the second thin film transistor T2 needs to be connected to the discharge line 23. The arrangement directions of the two electrodes of the first thin film transistor T1 are consistent with the arrangement directions of the two electrodes of the second thin film transistor T2, and the first electrode T11 and the second electrode T12 of the first thin film transistor T1 are arranged along the first direction X, such that a distance between the second electrode T22 of the second thin film transistor T2 and the discharge line 23 is small. In this way, it is conducive to reducing the parasitic capacitance generated between the second electrode T22 of the second thin film transistor T2 and the gate line 21.

In this example, a part of the discharge line 23 is multiplexed into the second electrode T22 of the second thin film transistor T2, which further reduces the parasitic capacitance, and facilitates the improvement of the display effect of the liquid crystal display panel.

As shown in FIG. 4, the first pixel unit of the array substrate further includes a second connection line 42. The first electrode T11 of the first thin film transistor T1 is electrically connected to the data line 22 by the second connection line 42. An orthographic projection of the second connection line 42 on the bearing surface is at least partially outside the orthographic projection of the gate line 21 on the bearing surface.

At least a part of the second connection line 42 is not overlapped with the gate line 21. That is, at least a part of the orthographic projection of the second connection line 42 on the bearing surface is outside the orthographic projection of the gate line 21 on the bearing surface. In this way, the parasitic capacitance between the second connection line 42 and the gate line 21 is reduced, which further facilitates the improvement of the display effect of the liquid crystal display panel.

In some examples, the second connection line 42 is not overlapped with the gate line 21. That is, the orthographic projection of the second connection line 42 on the bearing surface is entirely outside the orthographic projection of the gate line 21 on the bearing surface, such that the parasitic capacitance is further reduced.

Optionally, the second connection line 42 may be disposed in a same layer as the first electrode T11 of the first thin film transistor T1, such that processes are reduced, and the thickness of the base substrate is reduced.

As shown in FIG. 4, the second pixel unit includes a second pixel electrode 32 and a third thin film transistor T3. The first pixel electrode 31 and the second pixel electrode 32 are respectively disposed at both sides of the gate line 21. The third thin film transistor T3 is connected to the second pixel electrode 32 and the data line 22. A first electrode T31 of the third thin film transistor T3 is electrically connected to the data line 22, a second electrode T32 of the third thin film transistor T3 is electrically connected to the second pixel electrode 32, and a control electrode of the third thin film transistor T3 is electrically connected to the gate line 21.

The third thin film transistor T3 is configured to control an on/off state between the second pixel electrode 32 and the data line 22. The second pixel electrode 32 and the first pixel electrode 31 are electrically connected to the data line 22 by the thin film transistor. The first pixel electrode 31 is also electrically connected to the discharge line 23 by the second thin film transistor T2, and the discharge line 23 is connected to a signal line for providing a voltage approximate to a common voltage, for example, a signal line for providing a voltage of 7.7 V. In this way, in the liquid crystal display panel, a voltage between the first pixel electrode 31 and the common electrode is different from a voltage between the second pixel electrode 32 and the common electrode. In addition, in the liquid crystal display panel, orientations of the liquid crystal molecules in the regions corresponding to the second pixel electrode 32 and the first pixel electrode 31 are different, such that a multi-domain liquid crystal display effect is obtained.

Figure 5:
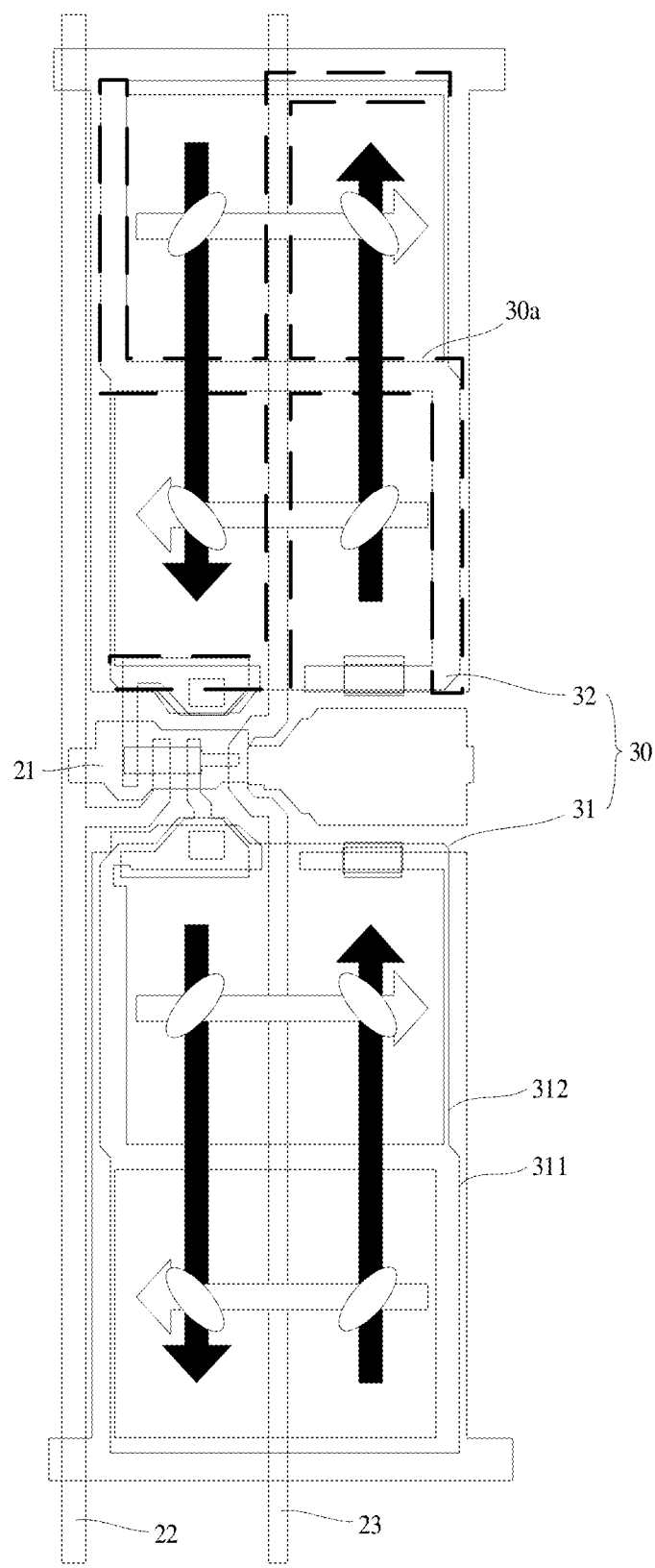
FIG. 5 is a schematic diagram of alignment in a liquid crystal display panel according to an embodiment of the present disclosure.

For example, FIG. 5 is a schematic diagram of alignment in a liquid crystal display panel according to an embodiment of the present disclosure. In FIG. 5, black arrows indicate the alignment directions of an array substrate in the liquid crystal display panel, white arrows indicate alignment directions of a color filter substrate in the liquid crystal display panel, and ellipses indicate liquid crystal molecules. As shown in FIG. 5, in the liquid crystal display panel, the liquid crystal molecules in regions where the first pixel electrode 31 and the second pixel electrode 32 are disposed respectively have four alignment directions by alignment. A voltage between the first pixel electrode 31 and the common electrode is different from a voltage between the second pixel electrode 32 and the common electrode. In this way, the liquid crystal display panel achieves a display effect that is equivalent to an eight-domain liquid crystal display effect, such that the liquid crystal display panel has a lower color shift and thus achieves a better display effect.

As shown in FIG. 5, the pixel electrode includes two parts misaligned with each other in the first direction X. The first pixel electrode 31 shown in FIG. 5 is taken as an example. The first pixel electrode 31 includes a first portion 311 and a second portion 312 that are connected to each other, wherein the first portion 311 and the second portion 312 are arranged along the second direction Y. The first part 311 and the second part 312 are misaligned with each other in the first direction X. That is, each of two opposite sides of the first part 311 in the first direction is not collinear with each of two sides of the second part 312 in the first direction X. In FIG. 5, the first portion 311 is offset to the right with respect to the second portion 312 by a distance. In a multi-domain pixel structure, orientations of liquid crystal molecules at an edge of the pixel electrode are relatively chaotic. Therefore, dark lines are formed in these regions when the liquid crystal display panel is displaying. For example, a region 30a of dark lines corresponding to a second pixel electrode 32 is substantially shown in FIG. 5, by a dotted line. A region of dark lines corresponding to the first pixel electrode 31 has a same shape as the region of dark lines 30a corresponding to the second pixel electrode 32. In this way, the aperture ratio is reduced, and the display effect is influenced. The pixel electrodes are arranged into two parts that are misaligned with each other, such that the aperture ratio of the pixels is improved, thereby improving the display effect.

As shown in FIG. 4, an active layer T30 of the third thin film transistor T3 may be connected to the active layer T10 of the first thin film transistor T1. The first electrode T11 of the first thin film transistor T1 is multiplexed into the first electrode T31 of the third thin film transistor T3. That is, the active layers of the two thin film transistors are integrally formed, and the first electrode T11 of the first thin film transistor T1 and the first electrode T31 of the third thin film transistor T3 are integrally formed. In this way, the parasitic capacitance between the first electrode T31 of the third thin film transistor T3 and the gate line 21 is further reduced, thereby further improving the display effect of the liquid crystal display panel.

In this example, the first thin film transistor T1, the second thin film transistor T2, and the third thin film transistor T3 are disposed between the data line 22 and the discharge line 23. The active layer T30 of the third thin film transistor T3, the active layer T10 of the first thin film transistor T1 and the active layer T20 of the second thin film transistor T2 are sequentially connected into a strip shape.

In some examples, a length of a channel region of the first thin film transistor T1 ranges from 4 μm to 5 μm, such as 4.4 μm; and a width of the channel region of the first thin film transistor T1 ranges from 5 μm to 15 μm, such as 10 μm. A length direction of the channel region of the first thin film transistor T1 is the arrangement direction of the first electrode T11 and the second electrode T12 of the first thin film transistor T1, and a width direction of the channel region of the first thin film transistor T1 is perpendicular to the length direction thereof.

A length of a channel region of the second thin film transistor T2 ranges from 8 μm to 14 μm, such as 10 μm; and a width of the channel region of the second thin film transistor T2 ranges from 3 μm to 4 μm, such as 3.4 μm. The differences between the voltage between the first pixel electrode 31 and the common electrode, and the voltage between the second pixel electrode 32 and the common electrode are changed by changing the length of the channel region of the second thin film transistor T2.

A length of a channel region of the third thin film transistor T3 is equal to the length of the channel region of the first thin film transistor T1, and a width of the channel region of the third thin film transistor T3 is equal to the width of the channel region of the first thin film transistor T1.

The directions of the first thin film transistor T1, the second thin film transistor T2, and the third thin film transistor T3 are consistent. The second electrode T32 of the third thin film transistor T3, the first electrode T31 of the third thin film transistor T3, the second electrode T12 of the first thin film transistor T1, and the second electrode T22 of the second thin film transistor T2 are sequentially arranged along the first direction X. The first electrode T11 of the first thin film transistor T1 is multiplexed into the first electrode T31 of the third thin film transistor T3. The second electrode T12 of the first thin film transistor T1 is multiplexed into the first electrode T21 of the second thin film transistor T2. A part of the discharge line 23 is multiplexed into the second electrode T22 of the second thin film transistor T2. A part on the gate line 21 is multiplexed into the control electrode of the first thin film transistor T1, another part on the gate line 21 is multiplexed into the control electrode of the second thin film transistor T2, and still another part on the gate line 21 is multiplexed into the control electrode of the third thin film transistor T3.

As shown in FIGS. 3 and 4, the first thin film transistor T1, the second thin film transistor T2 and the third thin film transistor T3 are distributed on a side of the discharge line 23. The lines, at both sides of the discharge line 23, of the gate line 21 have different widths. The line width of the gate line 21 is smaller on a side, proximal to the thin film transistor, of the discharge line 23, and the line width of the gate line 21 is greater on a side, distal form the thin film transistor, of the discharge line 23. In this way, it is conducive to further reducing the parasitic capacitance and improving the display effect of the liquid crystal display panel.

Figure 6:
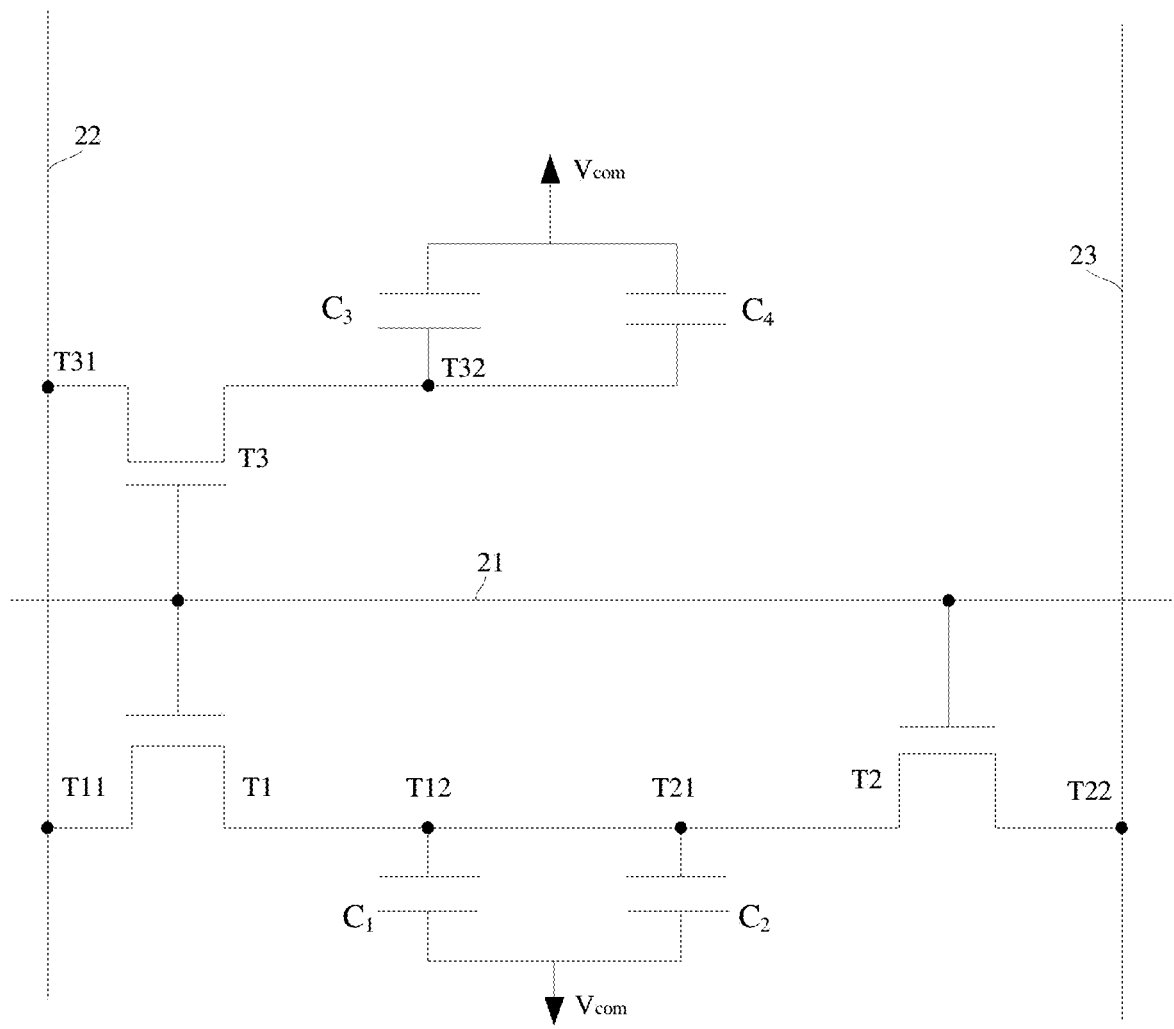
FIG. 6 is an equivalent circuit diagram of a liquid crystal display panel according to an embodiment of the present disclosure.

FIG. 6 is an equivalent circuit diagram of a liquid crystal display panel according to an embodiment of the present disclosure. The liquid crystal display panel includes an array substrate as shown in FIG. 4. In FIG. 6, $V_{com}$ represents the common voltage, and an arrow indicates that a terminal of each of capacitors in FIG. 6 is connected to a common voltage line, or to other signal lines capable of providing a voltage similar to or equal to the common voltage. As shown in FIG. 6, in the liquid crystal display panel, a first liquid crystal capacitor C1 is present between the second electrode T12 of the first thin film transistor T1 and the common voltage line, a first storage capacitor C2 is present between the first electrode T11 of the second thin film transistor T2 and the common voltage line, and a second liquid crystal capacitor C3 and a second storage capacitor C4 are present between the second electrode T32 of the third thin film transistor T3 and the common voltage line. One of two electrode plates of the first liquid crystal capacitor C1 may be the first pixel electrode 31, and the other one may be the common electrode. One of two electrode plates of the first storage capacitor C2 may be the first pixel electrode 31, and the other one may be the first storage capacitor electrode plate 24. One of two electrode plates of the second liquid crystal capacitor C3 may be the second pixel electrode 32, and the other one may be the common electrode. One of two electrode plates of the second storage capacitor C4 may be the second pixel electrode 32, and the other one may be the second storage capacitor electrode plate 25. Both the first storage capacitor electrode plate 24 and the second storage capacitor electrode plate 25 may be disposed in a same layer as the gate line 21. The first storage capacitor plate 24 and the second storage capacitor plate 25 are connected to the common voltage line. A potential of the first pixel electrode 31 is equal to a potential between the first thin film transistor T1 and the second thin film transistor T2. For example, the potential of the first pixel electrode 31 is equal to a potential of the second electrode T12 of the first thin film transistor T1, or to a potential of the first electrode T21 of the second thin film transistor T2. A potential of the second pixel electrode 32 is equal to a potential of the data line 22.

Referring to FIG. 2, the first storage capacitor plate 24 and the second storage capacitor plate 25 between two adjacent gate lines 21 may be connected to each other.

Figure 7:
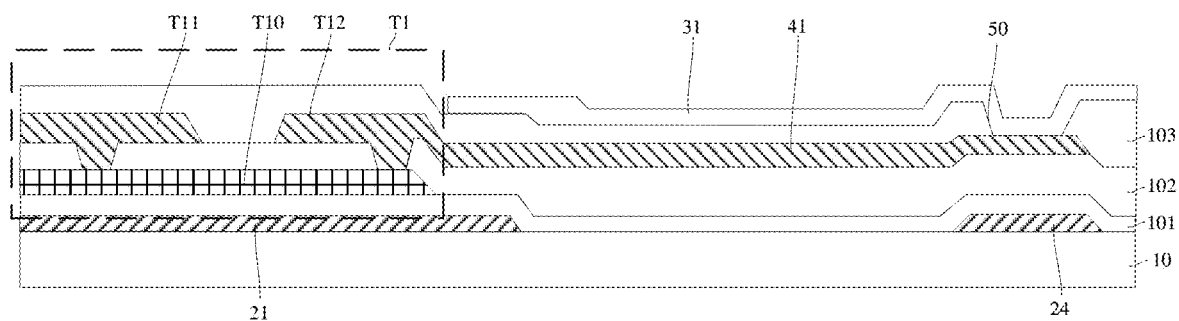
FIG. 7 is a cross-sectional view at a dotted line M in FIG. 4.

FIG. 7 is a cross-sectional view at a dotted line M in FIG. 4. As shown in FIG. 7, the base substrate is provided with a gate line 21, a first storage capacitor electrode plate 24 and a second storage capacitor electrode plate 25 on the bearing surface of the array substrate 10. A first insulative layer 101 is provided on the gate line 21, the first storage capacitor electrode plate 24 and the second storage capacitor electrode plate 25. An active layer, for example, the active layer T10 of the first thin film transistor T1 is disposed on the first insulative layer 101. A second insulative layer 102 is provided on the active layer, and a via hole is formed on the second insulative layer 102. The first electrode and second electrode of the thin film transistor, for example, the first electrode T11 and second electrode T12 of the first thin film transistor T1, are disposed on the second insulative layer 102, and are connected to the active layer T10 of the first thin film transistor T1 by the via hole. The first connection line 41 is also disposed on the second insulative layer 102. A third insulative layer 103 is disposed on the first connection line 41, and a via hole 50 is provided on the third insulative layer 103. A pixel electrode, for example, the first pixel electrode 31 is disposed on the third insulative layer 103, and is connected to the first connection line 41 by the via hole 50. The first pixel electrode 3 and the first storage capacitor plate 24 form the first storage capacitor C2.

The structures shown in FIG. 7 are illustrative, and part or all of the structures shown in FIG. 7 and other structures not shown in FIG. 7 may be included in other examples. For example, the second insulative layer 102 shown in FIG. 7 may not be included in some examples. That is, the first electrode and second electrode of the thin film transistor, and the first connection line 41 are directly formed on the active layer and the first insulative layer 101.

Figure 8:
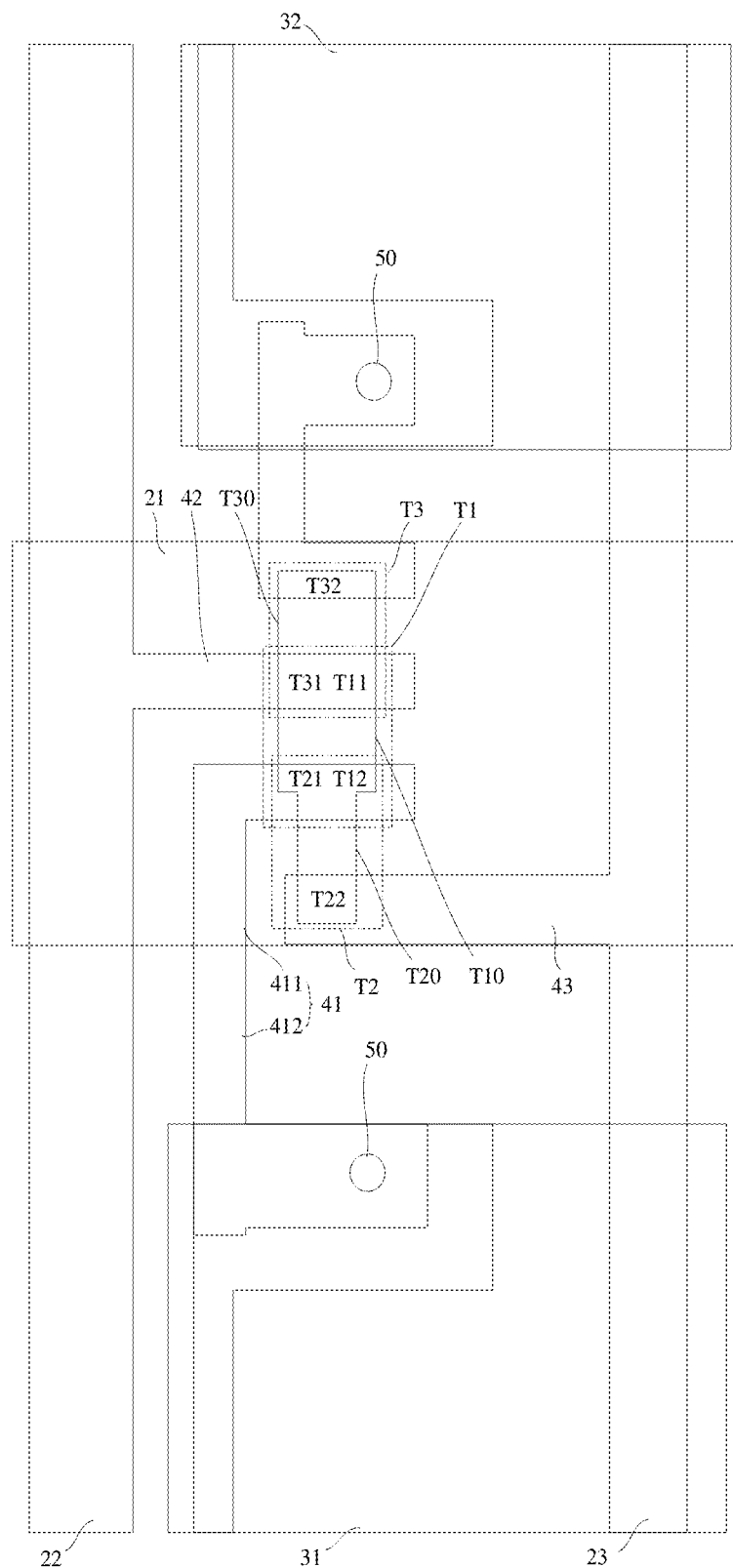
FIG. 8 is a schematic structural diagram of an array substrate according to an embodiment of the present disclosure.

FIG. 8 is a schematic structural diagram of an array substrate according to an embodiment of the present disclosure. As shown in FIG. 8, in the array substrate, the first electrode T11 and the second electrode T12 of the first thin film transistor T1 are arranged along the second direction Y.

In the array substrate, the directions of the first thin film transistor T1, the second thin film transistor T2 and the third thin film transistor T3 are consistent, all along the second direction Y. The second electrode T32 of the third thin film transistor T3, the first electrode T31 of the third thin film transistor T3, the second electrode T12 of the first thin film transistor T1, and the second electrode T22 of the second thin film transistor T2 are sequentially arranged along the second direction Y. The first electrode T11 of the first thin film transistor T1 is multiplexed into the first electrode T31 of the third thin film transistor T3. The second electrode T12 of the first thin film transistor T1 is multiplexed into the first electrode T21 of the second thin film transistor T2.

An array substrate of this structure is provided. Compared with the array substrate shown in FIG. 4, the space occupied by the thin film transistor in the first direction X is reduced, which is conducive to arranging a smaller-size pixel electrode in the first direction X. In this way, a larger number of pixel electrodes are arranged along the first direction X, thereby improving the resolution of the liquid crystal display device.

As shown in FIG. 8, the first pixel unit of the array substrate further includes a third connection line 43, and the second electrode T22 of the second thin film transistor T2 is electrically connected to the discharge line 23 by the third connection line 43.

The second thin film transistor T2 is arranged along the second direction Y, such that a certain distance is present between the second electrode T22 of the second thin film transistor T2 and the discharge line 23. The second electrode T22 of the second thin film transistor T2 is connected to the discharge line 23 by providing the third connection line 43.

Optionally, the third connection line 43 may be disposed in a same layer as the second electrode T22 of the second thin film transistor T2, or in a same layer as the discharge line 23, such that processes are reduced, and reduction of the thickness of the base substrate is facilitated.

In this example, the orthographic projection of the third connection line 43 on the bearing surface is within the orthographic projection of the gate line 21 on the bearing surface.

Figure 9:
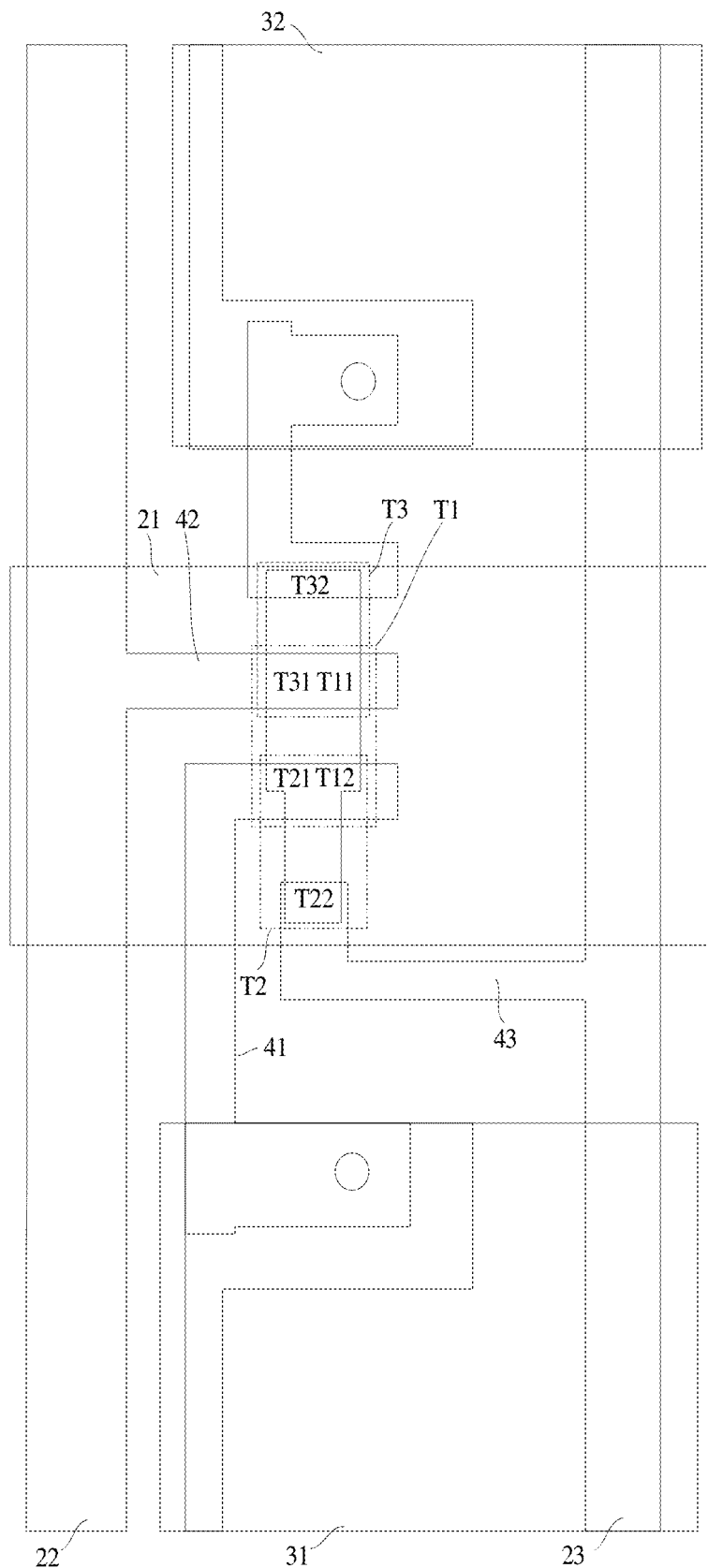
FIG. 9 is a schematic structural diagram of an array substrate according to an embodiment of the present disclosure.

In the array substrate shown in FIG. 8, the orthographic projection of the third connection line 43 on the bearing surface is within the orthographic projection of the gate line 21 on the bearing surface. FIG. 9 is a schematic structural diagram of an array substrate according to an embodiment of the present disclosure. As shown in FIG. 9, the difference between the array substrate and the array substrate shown in FIG. 8 is that the orthographic projection of the third connection line 43 on the bearing surface is at least partially outside the orthographic projection of the gate line 21 on the bearing surface.

Compared with the base substrate shown in FIG. 8, in FIG. 9, an area that the third connection line 43 overlapped with and the gate line 21 is smaller, and thereby the parasitic capacitance between the third connection line 43 and the gate line 21 is smaller, which is conducive to further improving the display effect of the liquid crystal display panel.

In this example, both the orthographic projection of the second electrode T22 of the second thin film transistor T2 on the bearing surface, and the orthographic projection of the second electrode T32 of the third thin film transistor T3 on the bearing surface are partially outside the orthographic projection of the gate line 21 on the bearing surface. In this way, the parasitic capacitance between the gate line 21 and the thin film transistor is further reduced.

In other examples, the first thin film transistor T1 and the second thin film transistor T2 may also be arranged along other directions. For example, a direction that forms a non-zero angle with both the first direction X and the second direction Y, or a direction that forms an included angle of 45 with the first direction X.

Figure 10:
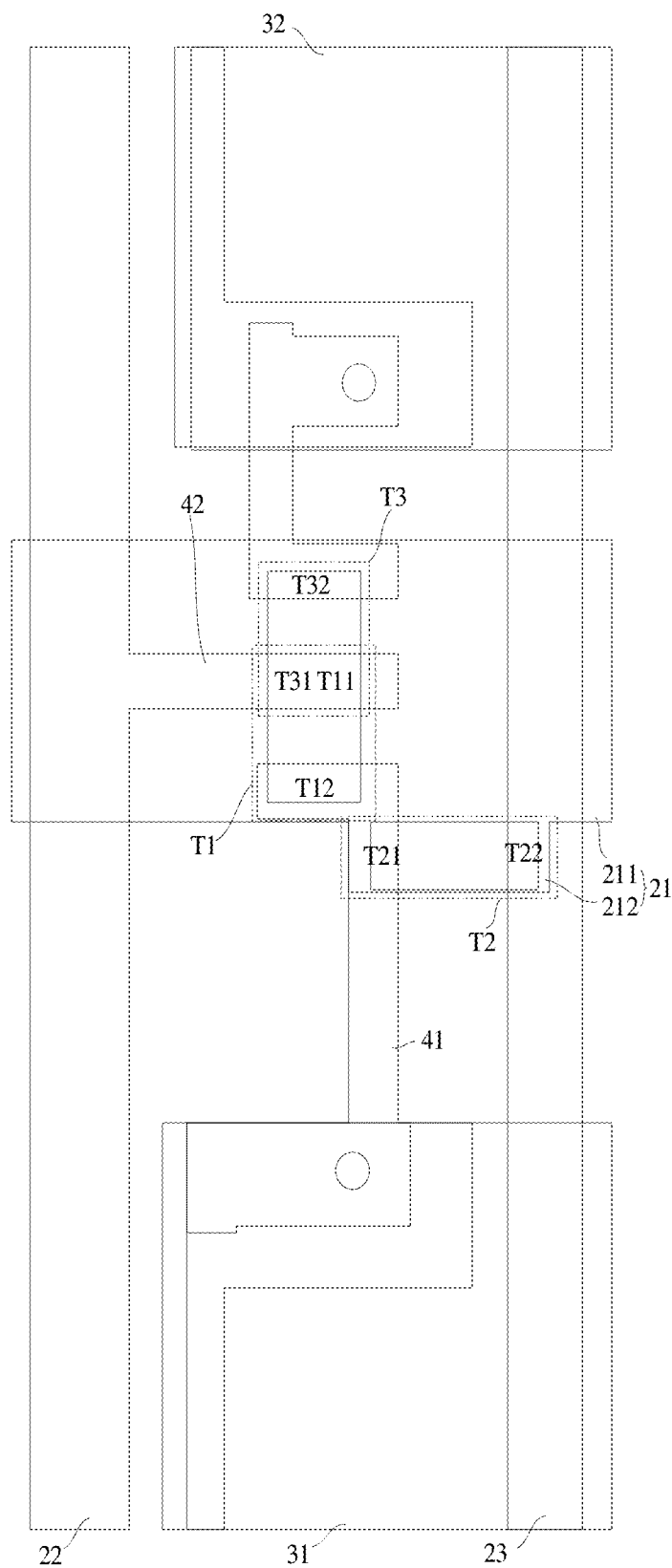
FIG. 10 is a schematic structural diagram of an array substrate according to an embodiment of the present disclosure.

FIG. 10 is a schematic structural diagram of an array substrate according to an embodiment of the present disclosure. As shown in FIG. 10, in the array substrate, the first electrode T11 and the second electrode T12 of the first thin film transistor T1 are arranged along the second direction Y, and the first electrode T21 and the second electrode T22 of the second thin film transistor T2 are arranged along the first direction X. That is, the directions of the first thin film transistor T1 and the third thin film transistor T3 are consistent, and both of the first thin film transistor T1 and the third thin film transistor T2 are arranged along the second direction Y, and the second thin film transistor T2 are arranged along the first direction X.

In this example, the second electrode T12 of the first thin film transistor T1 is connected to the first electrode T21 of the second thin film transistor T2, and the first connection line 41 is connected to the first electrode T21 of the second thin film transistor T2. The orthographic projection of the first connection line 41 on the bearing surface may be entirely outside the orthographic projection of the gate line 21 on the bearing surface, so as to further reduce the parasitic capacitance.

As shown in FIG. 10, the gate line 21 includes a body portion 211 and a branch portion 212 that are connected to each other. The orthographic projection of the first thin film transistor T1 on the bearing surface is at least partially overlapped with an orthographic projection of the body portion 211 on the bearing surface, and the control electrode of the first thin film transistor T1 is connected to the body portion 211. The orthographic projection of the second thin film transistor T2 on the bearing surface is at least partially overlapped with an orthographic projection of the branch portion 212 on the bearing surface, and the control electrode of the second thin film transistor T2 is connected to the branch portion 212.

In this example, the first thin film transistor T1 and the third thin film transistor T3 are arranged along the second direction Y. Compared with the array substrate shown in FIG. 4, a space occupied by the thin film transistor in the first direction X is reduced. The second thin film transistor T2 is arranged along the first direction X, which facilitates the connection between the second electrode T22 of the second thin film transistor T2 and the discharge line 23. For example, a part of the discharge line 23 is multiplexed into the second electrode T22 of the second thin film transistor T2, such that processes are reduced, and the display effect of the liquid crystal display panel is improved.

Figure 11:
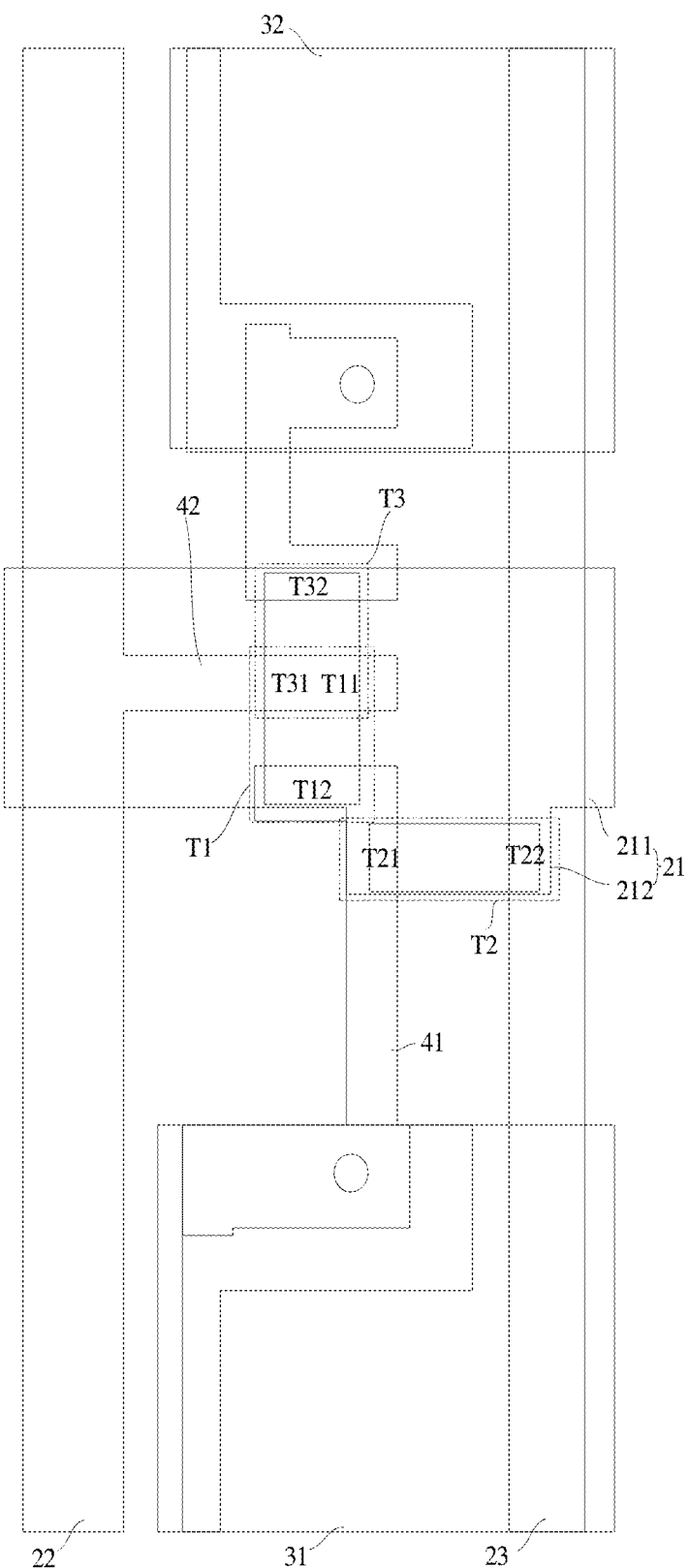
FIG. 11 is a schematic structural diagram of an array substrate according to an embodiment of the present disclosure.

FIG. 11 is a schematic structural diagram of an array substrate according to an embodiment of the present disclosure. As shown in FIG. 11, the difference between the array substrate and the array substrate shown in FIG. 10 is that both the orthographic projection of the second electrode T12 of the first thin film transistor T1 on the bearing surface, and the orthographic projection of the second electrode T32 of the third thin film transistor T3 on the bearing surface are partially outside the orthographic projection of the gate line 21 on the bearing surface. In this way, the parasitic capacitance between the gate line 21 and the thin film transistor is further reduced.

Figure 12:
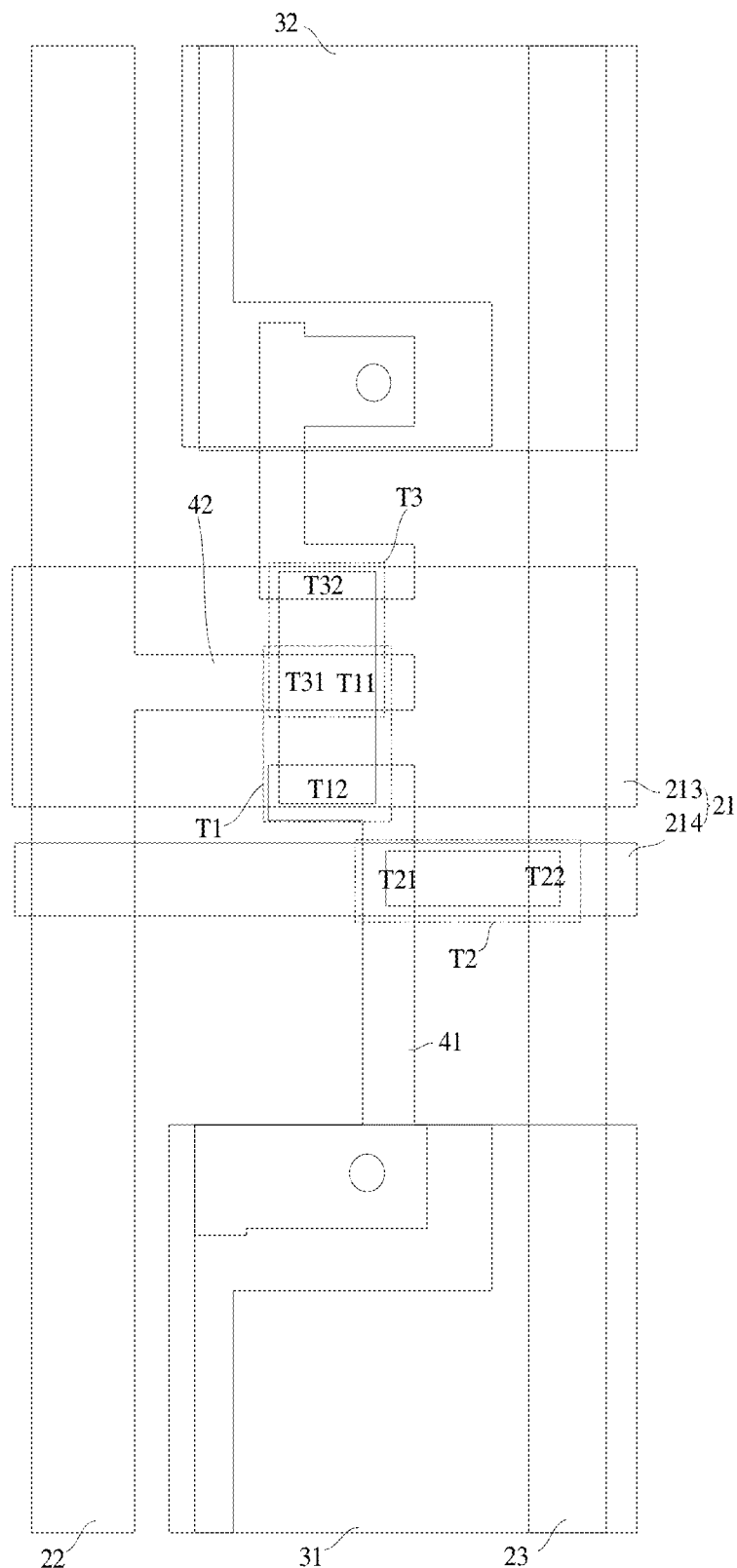
FIG. 12 is a schematic structural diagram of an array substrate according to an embodiment of the present disclosure.

FIG. 12 is a schematic structural diagram of an array substrate according to an embodiment of the present disclosure. As shown in FIG. 12, in this example, the first electrode T11 and the second electrode T12 of the first thin film transistor T1 are arranged along the second direction Y, and the first electrode T21 and the second electrode T22 of the second thin film transistor T2 are arranged along the first direction X. The second electrode T12 of the first thin film transistor T1 is electrically connected to the first electrode T21 of the second thin film transistor T2. The first connection line 41 is electrically connected to the first electrode T21 of the second thin film transistor T2.

As shown in FIG. 12, the gate line 21 includes a main gate line 213 and an auxiliary gate line 214. A gap is present between the main gate line 213 and the auxiliary gate line 214. The orthographic projection of the first thin film transistor T1 on the bearing surface is at least partially overlapped with an orthographic projection of the main gate line 213 on the bearing surface. The control electrode of the first thin film transistor T1 is electrically connected to the main gate line 213. The orthographic projection of the second thin film transistor T2 on the bearing surface is at least partially overlapped with an orthographic projection of the auxiliary gate line 214 on the bearing surface. The control electrode of the second thin film transistor T2 is electrically connected to the auxiliary gate line 214.

The main gate line 213 and the auxiliary gate line 214 may be configured to input a same control signal, or different control signals. The main gate line 213 is configured to input a control signal to control the on/off state of the first thin film transistor T1 and the third thin film transistor T3. The auxiliary gate line 214 is configured to input a control signal to control the on/off of state of the second thin film transistor T2. By arranging the main gate line 213 and the auxiliary gate line 214, the parasitic capacitance between the thin film transistor and the main gate line 213 is reduced, which is also conducive to improving the display effect of the liquid crystal display panel.

Figure 13:
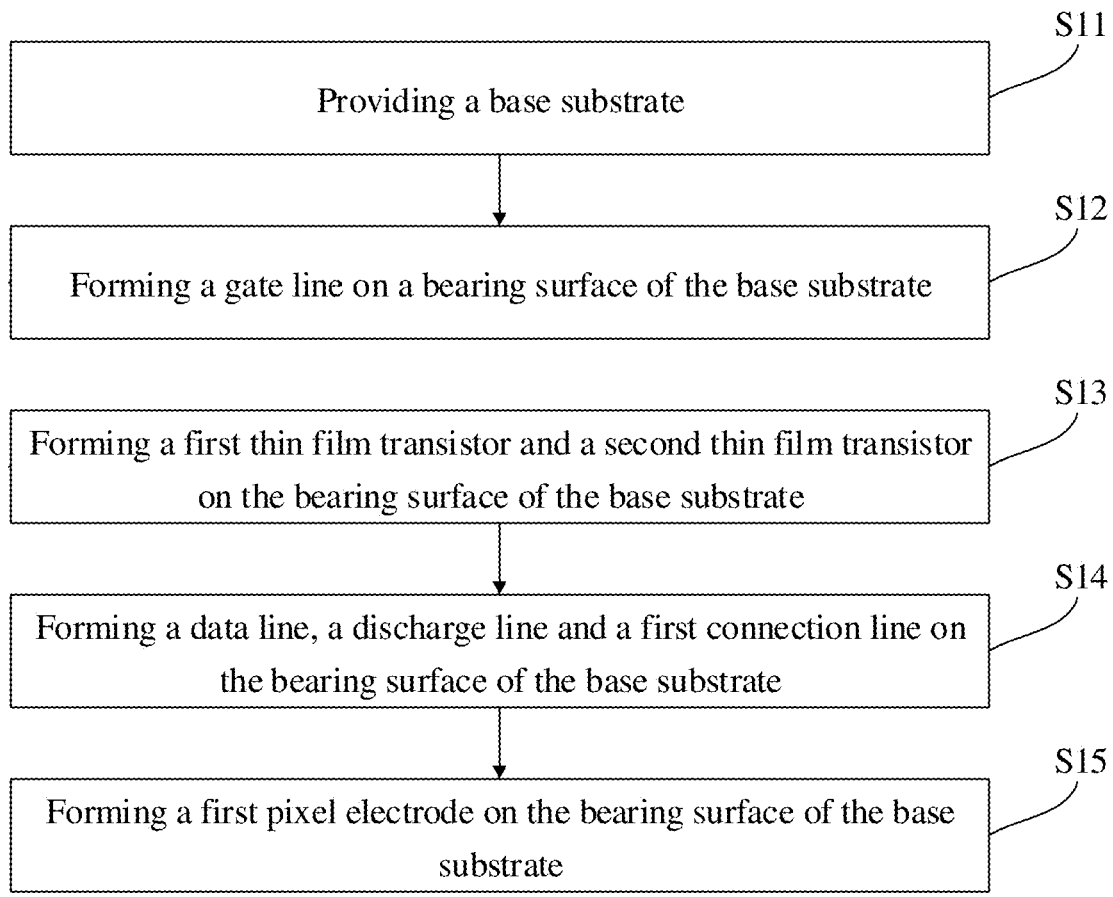
FIG. 13 is a flowchart of a method for manufacturing an array substrate according to an embodiment of the present disclosure.

FIG. 13 is a flowchart of a method for manufacturing an array substrate according to an embodiment of the present disclosure. The method is configured to manufacture any one of the array substrates shown in FIG. 1 to FIG. 12. The method includes:

In process S11, a base substrate 10 is provided.

In process S12, a gate line 21 is formed on a bearing surface of the base substrate 10.

The gate line 21 extends along the first direction X, and the first direction X is parallel to the bearing surface.

In process S13, a first thin film transistor T1 and a second thin film transistor T2 are formed on the bearing surface of the base substrate 10.

Orthographic projections of the first thin film transistor T1 and the second thin film transistor T2 on the bearing surface are at least partially overlapped with an orthographic projection of the gate line 21 on the bearing surface. A control electrode of the first thin film transistor T1 and a control electrode of the second thin film transistor T2 are both electrically connected to the gate line 21.

In process S14, a data line 22, a discharge line 23, and a first connection line 41 are formed on the bearing surface of the base substrate 10.

The data line 22 extends along the second direction Y, and the discharge line 23 extends along the third direction Z. Both the second direction Y and the third direction Z are parallel to the bearing surface, and the second direction Y is intersected with the first direction X. The gate line 21 and the data line 22 are intersected with each other to define a plurality of sub-pixel regions. The data line 22 is electrically connected to the first electrode T11 of the first thin film transistor T1. The discharge line 23 is electrically connected to the second electrode T22 of the second thin film transistor T2. The first connection line 41 is electrically connected to the second electrode T22 of the first thin film transistor T1, and the first electrode T21 of the second thin film transistor T2.

In process S15, the first pixel electrode 31 is formed on the bearing surface of the base substrate 10.

The first pixel electrode 31 is disposed at a side of the gate line 21, and a plurality of first pixel electrodes 31 are respectively disposed in a plurality of sub-pixel regions. The first pixel electrode 31 is electrically connected to the first connection line 41 to form a plurality of first pixel units on the bearing surface of the base substrate 10.

In the array substrate according to the embodiment of the present disclosure, the second electrode T12 of the first thin film transistor T1 and the first electrode T21 of the second thin film transistor T2 are both connected to the first pixel electrode 31 by the first connection line 41. In this way, there is no need for the second electrode T12 of the first thin film transistor T1 and the first electrode T21 of the second thin film transistor T2 to be connected to the first pixel electrode 31 by different connection lines respectively. Therefore, the number of connection lines that need to be arranged is reduced, and thus a total area of overlap regions between the connection lines and the gate line 21 is reduced. In this way, the parasitic capacitance is reduced, which is conducive to improving the display effect of the liquid crystal display panel.

It should be noted that, an insulative layer is also formed on the bearing surface, when manufacturing the array substrate, to insulate some structures from each other, for example, to insulate the gate line 21, the data line 22 and the discharge line 23 from each other.

For example, as shown in FIG. 7, a first insulative layer 101 is formed on the bearing surface after the gate line 21 is formed, and the gate line 21 is at least partially covered by the first insulative layer 101.

For the array substrates shown in FIG. 3 to FIG. 12, the first thin film transistor T1, the second thin film transistor T2 and the third thin film transistor T3 may be manufactured together. Exemplarily, when the thin film transistor is manufactured in process S13, the active layers of the third thin film transistor T3, the first thin film transistor T1 and the second thin film transistor T2 may be formed on the first insulative layer 101. The active layers of these three thin film transistors may be connected to each other, or may not be connected.

The array substrate shown in FIG. 4 is taken as an example. Referring to FIG. 7, the active layers of these three thin film transistors are connected together. Next, a second insulative layer 102 is formed on the bearing surface, and the second insulative layer 102 at least covers the active layer. A via hole may also be formed on the second insulative layer 102, such that a structure formed subsequently is connected to the active layer by the via hole. Then, the first electrode T31 and the second electrode T32 of the third thin film transistor T3, the first electrode T11 and the second electrode T12 of the first thin film transistor T1, and the first electrode T21 and the second electrode T22 of the second thin film transistor T2 are formed on the second insulative layer.

In some examples, to reduce processes and reduce the thickness of the array substrate, the first electrode T31 and the second electrode T32 of the third thin film transistor T3, the first electrode T11 and the second electrode T12 of the first thin film transistor T1, the first electrode T21 and the second electrode T22 of the second thin film transistor T2, the first connection line 41, the data line 22, the discharge line 23, the second connection line 42, and the third connection line 43 may all be formed together, for example, formed by a same patterning process using a same film layer.

In some examples, the second insulative layer 102 may also be omitted, and the first electrode and the second electrode of the thin film transistor, and the first connection line 41 are directly formed on the active layer and the first insulative layer 101. In this way, the processes are further reduced, and the thickness of the array substrate is reduced.

A third insulative layer 103 may also be formed on the thin film transistor after the thin film transistor is formed. The third insulative layer 103 is provided with a via hole 50, to facilitate connection of the pixel electrode subsequently formed, such as the first pixel electrode 31, to the first line 41.

Figure 14:
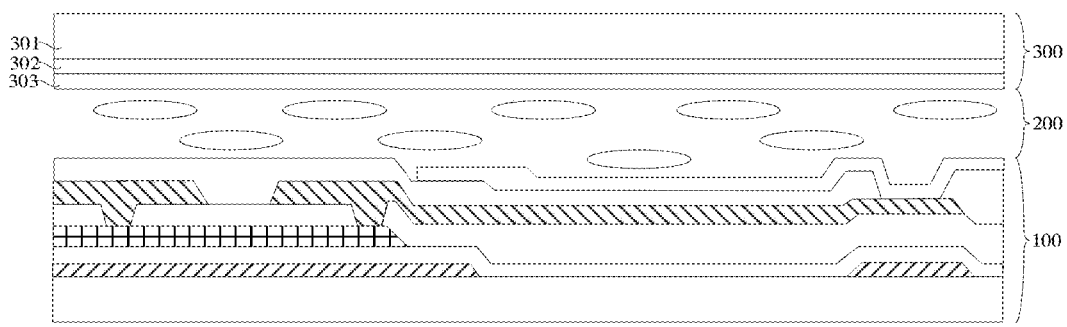
FIG. 14 is a schematic structural diagram of a liquid crystal display panel according to an embodiment of the present disclosure.

An embodiment of the present disclosure further provides a liquid crystal display panel. FIG. 14 is a schematic structural diagram of a liquid crystal display panel according to an embodiment of the present disclosure. As shown in FIG. 14, the liquid crystal display panel includes a color filter substrate 300, a liquid crystal layer 200 and any one of the array substrates 100 shown in FIGS. 1 to 12. For example, as shown in FIG. 14, the color filter substrate 300 is arranged opposite to the array substrate 100, and the liquid crystal layer 200 is disposed between the color filter substrate 300 and the array substrate 100.

The color filter substrate 300 includes a transparent substrate 301, a color filter layer 302 disposed at a side of the transparent substrate 301, and a common electrode 303 disposed on the color filter layer 302.

An embodiment of the present disclosure further provides a display device. The display device includes a backlight, and a liquid crystal display panel as shown in FIG. 14. The backlight is disposed at a side, distal from the color filter substrate 300, of the array substrate 100.

The display device may be, but not limited to, a mobile phone, a notebook computer, a tablet computer, a display, a navigator, or a digital camera.

Described above are merely optional embodiments of the present disclosure, and are not intended to limit the present disclosure. Any modification, equivalent substitution, improvement, and the like made should be included in the protection scope of the present disclosure, without departing from the spirit and principle of the present disclosure.

What is claimed is:

1. An array substrate, comprising a base substrate, a signal line and a plurality of first pixel units; wherein
the signal line is disposed on a bearing surface of the base substrate, and comprises a gate line, a data line, and a discharge line that are insulated from each other, wherein the gate line extends along a first direction, the data line extends along a second direction, the discharge line extends along a third direction, both the second direction and the third direction being intersected with the first direction, and the gate line and the data line are intersected with each other to define a plurality of sub-pixel regions; and
the first pixel unit comprises a first pixel electrode, a first thin film transistor, a second thin film transistor, and a first connection line; wherein
a plurality of the first pixel electrodes are respectively disposed in the plurality of sub-pixel regions, and orthographic projections of the first thin film transistor and the second thin film transistor on the bearing surface are both at least partially overlapped with an orthographic projection of the gate line on the bearing surface; and
a control electrode of the first thin film transistor and a control electrode of the second thin film transistor are both electrically connected to the gate line, a first electrode of the first thin film transistor is electrically connected to the data line, a second electrode of the first thin film transistor and a first electrode of the second thin film transistor are both electrically connected to the discharge line by the first connection line, and a second electrode of the second thin film transistor is electrically connected to the discharge line,
wherein the first pixel electrode comprises a first part and a second part that are connected to each other, wherein the first part and the second part are arranged along the second direction, the first part and the second part are misaligned with each other in the first direction, and an orthographic projection of the data line on the bearing surface is not overlapped with an orthographic projection of the first part on the bearing surface and an orthographic projection of the second part on the bearing surface, and
wherein the first pixel unit further comprises a first storage capacitor electrode plate, the first storage capacitor electrode plate and the first pixel electrode form a first storage capacitor, and wherein the first storage capacitor electrode plate comprises a first extension portion, a second extension portion, a third extension portion, a fourth extension portion, a fifth extension portion, a sixth extension portion, and a seventh extension portion sequentially connected, the first extension portion, the fourth extension portion and the seventh extension portion extend along the first direction, the second extension portion, the third extension portion, the fifth extension portion and the sixth extension portion extend along the second direction, the second extension portion and the sixth extension portion are arranged opposite each other along the first direction, the third extension portion and the fifth extension portion are arranged opposite each other along the first direction, a width of either the second extension portion or the fifth extension portion along the first direction is greater than a width of the third extension portion along the first direction and is greater than a width of the sixth extension portion along the first direction, the orthographic projection of the first part on the bearing surface is partially overlapped with orthographic projections of the second extension portion and the sixth extension portion on the bearing surface, the orthographic projection of the second part on the bearing surface is partially overlapped with orthographic projections of the third extension portion and the fifth extension portion on the bearing surface; a gap exists between the first extension portion and the seventh extension portion, an orthographic projection of the discharge line on the bearing surface is partially within an orthographic projection of the gap on the bearing surface, and is not overlapped with an orthographic projection of the first extension portion on the bearing surface and is not overlapped with an orthographic projection of the seventh extension portion on the bearing surface.

2. The array substrate according to claim 1, wherein an orthographic projection of the first connection line on the bearing surface is outside the orthographic projection of the gate line on the bearing surface.

3. The array substrate according to claim 1, wherein the first connection line is disposed in a same layer as at least one of the second electrode of the first thin film transistor, the first electrode of the second thin film transistor, the data line, and the discharge line.

4. The array substrate according to claim 1, wherein an active layer of the first thin film transistor is connected to an active layer of the second thin film transistor, and the second electrode of the first thin film transistor is multiplexed into the first electrode of the second thin film transistor.

5. The array substrate according to claim 1, wherein arrangement directions of the first electrode and the second electrode of the first thin film transistor are consistent with arrangement directions of the first electrode and the second electrode of the second thin film transistor.

6. The array substrate according to claim 5, wherein
the first electrode and the second electrode of the first thin film transistor are arranged along the first direction; and the first pixel unit further comprises a second connection line, wherein the first electrode of the first thin film transistor is electrically connected to the data line by the second connection line, and an orthographic projection of the second connection line on the bearing surface is at least partially outside the orthographic projection of the gate line on the bearing surface.

7. The array substrate according to claim 5, wherein
the first electrode and the second electrode of the first thin film transistor are arranged along the second direction; and
the first pixel unit further comprises a third connection line, wherein the second electrode of the second thin film transistor is electrically connected to the discharge line by the third connection line, and an orthographic projection of the third connection line on the bearing surface is within the orthographic projection of the gate line on the bearing surface.

8. The array substrate according to claim 5, wherein
the first electrode and the second electrode of the first thin film transistor are arranged along the second direction; and
the first pixel unit further comprises a third connection line, wherein the second electrode of the second thin film transistor is electrically connected to the discharge line by the third connection line, and an orthographic projection of the third connection line on the bearing surface is at least partially outside the orthographic projection of the gate line on the bearing surface.

9. The array substrate according to claim 1, wherein the first electrode and the second electrode of the first thin film transistor are arranged along the second direction, and the first electrode and the second electrode of the second thin film transistor are arranged along the first direction.

10. The array substrate according to claim 9, wherein the gate line comprises a body portion and a branch portion that are connected to each other; wherein
the orthographic projection of the first thin film transistor on the bearing surface is at least partially overlapped with an orthographic projection of the body portion on the bearing surface, and the control electrode of the first thin film transistor is electrically connected to the body portion; and
the orthographic projection of the second thin film transistor on the bearing surface is at least partially overlapped with an orthographic projection of the branch portion on the bearing surface, and the control electrode of the second thin film transistor is electrically connected to the branch portion.

11. The array substrate according to claim 9, wherein the gate line comprises a main gate line and an auxiliary gate line; wherein
a gap is present between the main gate line and the auxiliary gate line, the orthographic projection of the first thin film transistor on the bearing surface is at least partially overlapped with an orthographic projection of main gate line on the bearing surface, and the control electrode of the first thin film transistor is electrically connected to main gate line; and
the orthographic projection of the second thin film transistor on the bearing surface is at least partially overlapped with an orthographic projection of the auxiliary gate line on the bearing surface, and the control electrode of the second thin film transistor is electrically connected to the auxiliary gate line.

12. The array substrate according to claim 1, further comprising a plurality of second pixel units; wherein
the second pixel unit comprises a second pixel electrode and a third thin film transistor, wherein a plurality of the second pixel electrodes are respectively disposed in the plurality of sub-pixel regions, and the second pixel electrodes and the first pixel electrodes are alternately distributed in the second direction; and
a first electrode of the third thin film transistor is electrically connected to the data line, a second electrode of the third thin film transistor is connected to the second pixel electrode and a control electrode of the third thin film transistor is electrically connected to the gate line.

13. The array substrate according to claim 12, wherein
a length of a channel region of the first thin film transistor ranges from 4 μm to 5 μm, and a width of the channel region of the first thin film transistor ranges from 5 μm to 15 μm;
a length of a channel region of the second thin film transistor ranges from 8 μm to 14 μm, and a width of the channel region of the second thin film transistor ranges from 3 μm to 4 μm; and
a length and a width of a channel region of the third thin film transistor are respectively equal to the length and the width of the channel region of the first thin film transistor.

14. The array substrate according to claim 1, wherein
the first connection line comprises an overlap segment and a connection segment that are connected to each other; wherein
an orthographic projection of the overlap segment on the bearing surface is within the orthographic projection of the gate line on the bearing surface, the overlap segment is perpendicular to the first direction, and the overlap segment is electrically connected to the second electrode of the first thin film transistor and the first electrode of the second thin film transistor; and
an orthographic projection of the connection segment on the bearing surface is outside the orthographic projection of the gate line on the bearing surface, and the connection segment is electrically connected to the first pixel electrode.

15. A method for manufacturing an array substrate, the method comprising:
providing a base substrate;
forming a gate line on a bearing surface of the base substrate, wherein the gate line extends along a first direction;
forming a first thin film transistor and a second thin film transistor on the bearing surface of the base substrate, wherein orthographic projections of the first thin film transistor and the second thin film transistor on the bearing surface are both at least partially overlapped with an orthographic projection of the gate line on the bearing surface, and a control electrode of the first thin film transistor and a control electrode of the second thin film transistor are both electrically connected to the gate line;
forming a data line, a discharge line, and a first connection line on the bearing surface of the base substrate, wherein the data line extends along a second direction, the discharge line extends along a third direction, the second direction and the third direction both being intersected with the first direction, and the gate line and the data line are intersected with each other to define a plurality of sub-pixel regions, the data line is electrically connected to a first electrode of the first thin film transistor, the discharge line is electrically connected to a second electrode of the second thin film transistor, and the first connection line is electrically connected to a second electrode of the first thin film transistor and a first electrode of the second thin film transistor;

forming a plurality of first pixel electrodes on the bearing surface of the base substrate, wherein the plurality of first pixel electrodes are respectively disposed in the plurality of sub-pixel regions, and the first pixel electrode is electrically connected to the first connection line to form a plurality of first pixel units on the bearing surface of the base substrate; and forming a first storage capacitor electrode plate on the bearing surface of the base substrate, wherein the first storage capacitor electrode plate and the first pixel electrode form a first storage capacitor, wherein the first pixel electrode comprises a first part and a second part that are connected to each other, wherein the first part and the second part are arranged along the second direction, the first part and the second part are misaligned with each other in the first direction, and an orthographic projection of the data line on the bearing surface is not overlapped with an orthographic projection of the first part on the bearing surface and an orthographic projection of the second part on the bearing surface, and wherein the first storage capacitor electrode plate comprises a first extension portion, a second extension portion, a third extension portion, a fourth extension portion, a fifth extension portion, a sixth extension portion, and a seventh extension portion sequentially connected, the first extension portion, the fourth extension portion and the seventh extension portion extend along the first direction, the second extension portion, the third extension portion, the fifth extension portion and the sixth extension portion extend along the second direction, the second extension portion and the sixth extension portion are arranged opposite each other along the first direction, the third extension portion and the fifth extension portion are arranged opposite each other along the first direction, a width of either the second extension portion or the fifth extension portion along the first direction is greater than a width of the third extension portion along the first direction and is greater than a width of the sixth extension portion along the first direction, the orthographic projection of the first part on the bearing surface is partially overlapped with orthographic projections of the second extension portion and the sixth extension portion on the bearing surface, the orthographic projection of the second part on the bearing surface is partially overlapped with orthographic projections of the third extension portion and the fifth extension portion on the bearing surface; a gap exists between the first extension portion and the seventh extension portion, an orthographic projection of the discharge line on the bearing surface is partially within an orthographic projection of the gap on the bearing surface, and is not overlapped with an orthographic projection of the first extension portion on the bearing surface and is not overlapped with an orthographic projection of the seventh extension portion on the bearing surface.

16. A liquid crystal display panel, comprising: a color filter substrate, a liquid crystal layer, and an array substrate; wherein the color filter substrate is arranged opposite to the array substrate;

the liquid crystal layer is disposed between the color filter substrate and the array substrate; and the array substrate comprises a base substrate, a signal line and a plurality of first pixel units; wherein the signal line is disposed on a bearing surface of the base substrate, and comprises a gate line, a data line, and a discharge line that are insulated from each other, wherein the gate line extends along a first direction, the data line extends along a second direction, the discharge line extends along a third direction, both the second direction and the third direction being intersected with the first direction, and the gate line and the data line are intersected with each other to define a plurality of sub-pixel regions;

the first pixel unit comprises a first pixel electrode, a first thin film transistor, a second thin film transistor, and a first connection line; wherein a plurality of the first pixel electrodes are respectively disposed in the plurality of sub-pixel regions, and orthographic projections of the first thin film transistor and the second thin film transistor on the bearing surface are both at least partially overlapped with an orthographic projection of the gate line on the bearing surface; and a control electrode of the first thin film transistor and a control electrode of the second thin film transistor are both electrically connected to the gate line, a first electrode of the first thin film transistor is electrically connected to the data line, a second electrode of the first thin film transistor and a first electrode of the second thin film transistor are both electrically connected to the discharge line by the first connection line, and a second electrode of the second thin film transistor is electrically connected to the discharge line, wherein the first pixel electrode comprises a first part and a second part that are connected to each other, wherein the first part and the second part are arranged along the second direction, the first part and the second part are misaligned with each other in the first direction, and an orthographic projection of the data line on the bearing surface is not overlapped with an orthographic projection of the first part on the bearing surface and an orthographic projection of the second part on the bearing surface, and wherein the first pixel unit further comprises a first storage capacitor electrode plate, the first storage capacitor electrode plate and the first pixel electrode form a first storage capacitor, and wherein the first storage capacitor electrode plate comprises a first extension portion, a second extension portion, a third extension portion, a fourth extension portion, a fifth extension portion, a sixth extension portion, and a seventh extension portion sequentially connected, the first extension portion, the fourth extension portion and the seventh extension portion extend along the first direction, the second extension portion, the third extension portion, the fifth extension portion and the sixth extension portion extend along the second direction, the second extension portion and the sixth extension portion are arranged opposite each other along the first direction, the third extension portion and the fifth extension portion are arranged opposite each other along the first direction, a width of either the second extension portion or the fifth extension portion along the first direction is greater than a width of the third extension portion along the first direction and is greater than a width of the sixth extension portion along the first direction, the orthographic projection of the first part on the bearing surface is partially overlapped with orthographic projections of the second extension portion and the sixth extension portion on the bearing surface, the orthographic projection of the second part on the bearing surface is partially overlapped with orthographic projections of the third extension portion and the fifth extension portion on the bearing surface; a gap exists between the first extension portion and the seventh extension portion, an orthographic projection of the discharge line on the bearing surface is partially within an orthographic projection of the gap on the bearing surface, and is not overlapped with an orthographic projection of the first extension portion on the bearing surface and is not overlapped with an orthographic projection of the seventh extension portion on the bearing surface.

17. A display device, comprising: a backlight, and the liquid crystal display panel as defined in claim 16; wherein the backlight is disposed at a side, distal from the color filter substrate, of the array substrate.

18. The liquid crystal display panel according to claim 16, wherein an orthographic projection of the first connection line on the bearing surface is outside the orthographic projection of the gate line on the bearing surface.

19. The liquid crystal display panel according to claim 16, wherein the first connection line comprises an overlap segment and a connection segment that are connected to each other; wherein an orthographic projection of the overlap segment on the bearing surface is within the orthographic projection of the gate line on the bearing surface, the overlap segment is perpendicular to the first direction, and the overlap segment is electrically connected to the second electrode of the first thin film transistor and the first electrode of the second thin film transistor; and an orthographic projection of the connection segment on the bearing surface is outside the orthographic projection of the gate line on the bearing surface, and the connection segment is electrically connected to the first pixel electrode.

\* \* \* \* \*